(12) United States Patent
Mukai et al.

(10) Patent No.: US 6,425,325 B1
(45) Date of Patent: Jul. 30, 2002

(54) OFFSET PRINTING METHOD AND OFFSET PRINTING APPARATUS

(75) Inventors: Yasuo Mukai, Yokohama; Ippei Sawayama, Machida; Masayuki Kusakari, Tokyo; Takaomi Ishida, Kawaguchi, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/492,354

(22) Filed: Jan. 27, 2000

(30) Foreign Application Priority Data

| Jan. 26, 1999 | (JP) | 11-016744 |
|---|---|---|
| Feb. 25, 1999 | (JP) | 11-049205 |
| Feb. 25, 1999 | (JP) | 11-049206 |
| Feb. 25, 1999 | (JP) | 11-049211 |
| Nov. 29, 1999 | (JP) | 11-338078 |
| Nov. 30, 1999 | (JP) | 11-340516 |
| Jan. 20, 2000 | (JP) | 2000-011848 |

(51) Int. Cl.$^7$ ................................ B41F 3/34
(52) U.S. Cl. ................ 101/130; 101/146; 101/251; 101/492
(58) Field of Search ................ 101/142, 146, 101/217, 215, 251, 492, 133, 134.5, 131, 130, 131.5

(56) References Cited

U.S. PATENT DOCUMENTS

| 1,823,952 A | * | 9/1931 | Phibbs | 101/133 |
| 1,983,517 A | * | 12/1934 | Bradt | 101/133 |
| 5,553,539 A | * | 9/1996 | Hasegawa | 101/129 |

FOREIGN PATENT DOCUMENTS

| JP | 01-182047 | 7/1989 |
| JP | 05-169622 | 7/1993 |
| JP | 06-171062 | 6/1994 |
| JP | 07-125179 | 5/1995 |

* cited by examiner

*Primary Examiner*—Daniel J. Colilla
(74) *Attorney, Agent, or Firm*—Fitzpatrick, Cella, Harper & Scinto

(57) ABSTRACT

An offset printing method comprises the steps of: a process for suspending a sheet-shaped or belt-shaped blanket by supporting both ends thereof at the leading and trailing ends thereof in the printing direction; and a process for performing ink reception from a plate to the blanket and also transferring ink from the blanket to a work, by pressing the blanket by a pressuring jig from an upwards direction down onto a plate or work situated below and sweeping in the printing direction. An offset printing apparatus is configured so as to carry out this method.

35 Claims, 17 Drawing Sheets

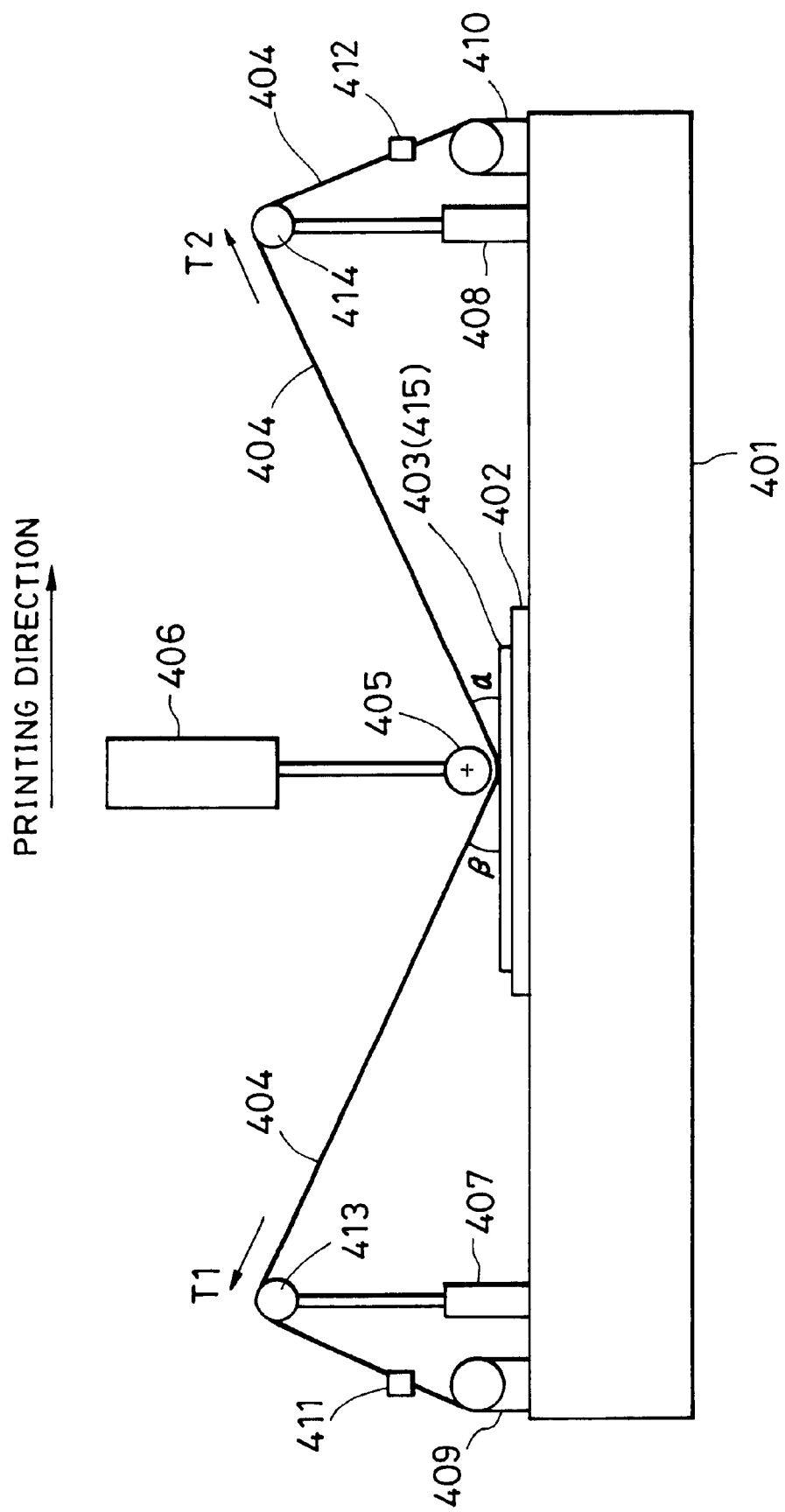

CASE WHEREIN BLANKET TENSION IS SET EQUALLY

CASE WHEREIN LEFT AND RIGHT BLANKET TENSION IS SET
SO THAT PATTERN IS EQUAL AT TIME OF RECEPTION AND TRANSFER

CASE WHEREIN LEFT AND RIGHT TENSION IS CONTROLLED SEPARATELY
ONLY AT THE TIME OF TRANSFER. AND SET SO THAT PATTERN IS EQUAL
AT TIME OF TRANSFER (OTHER EMBODIMENT)

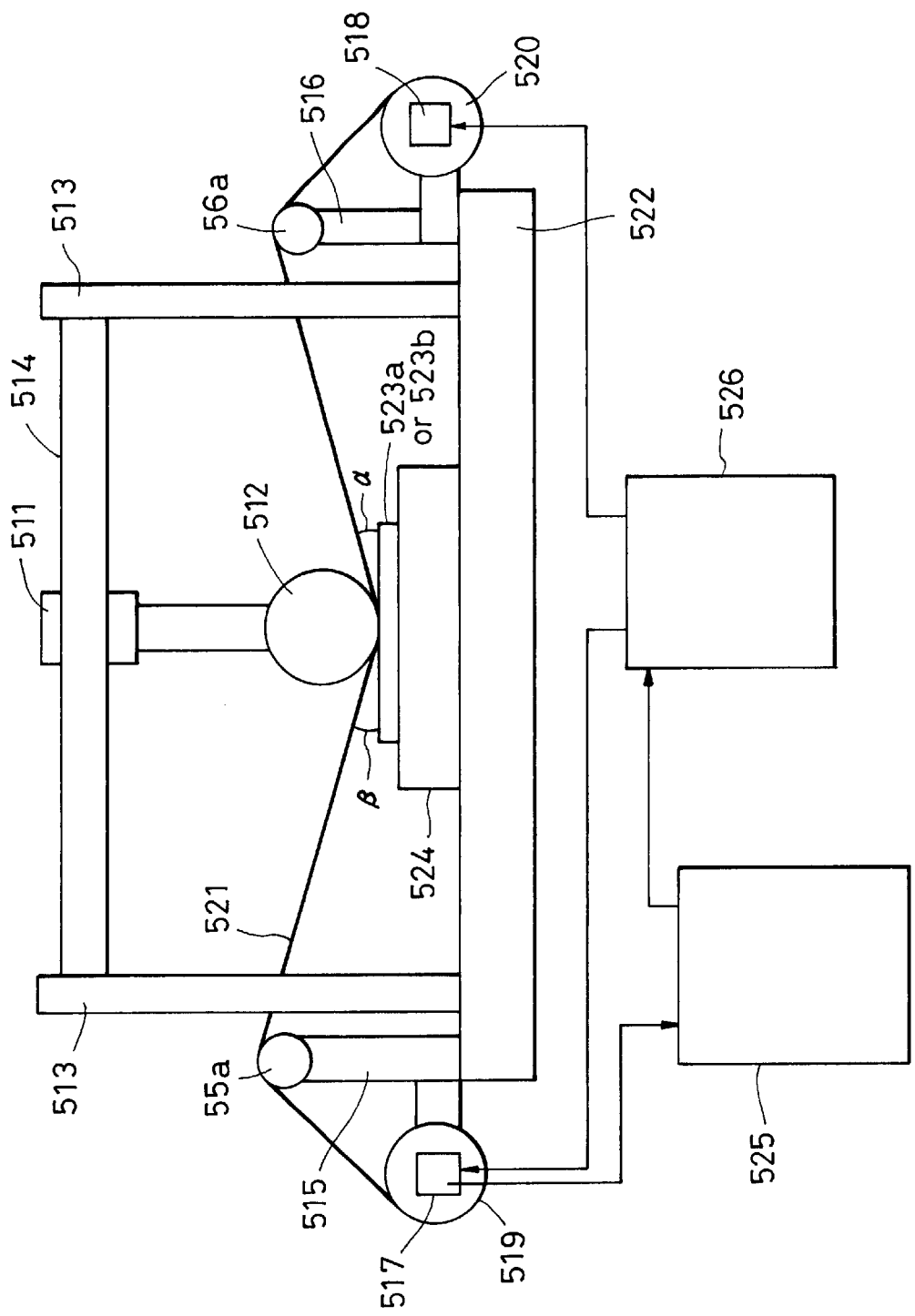

FACE USED FOR PRINTING

FIG. 18A
FIG. 18B
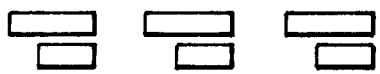
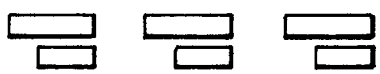
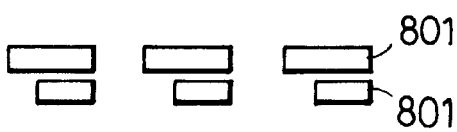
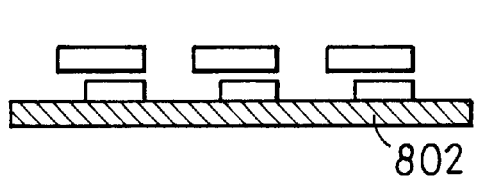
FIG. 18C
FIG. 18D
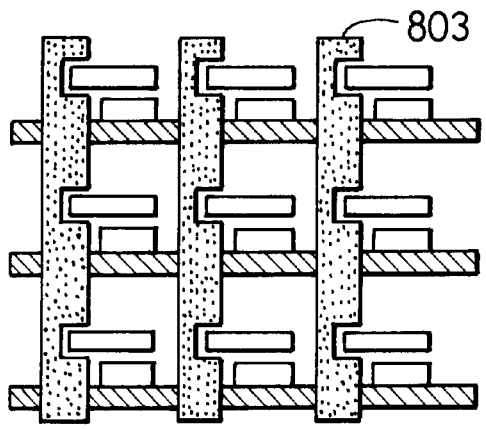
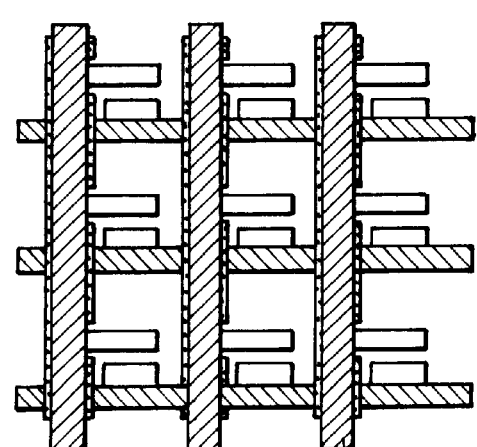
FIG. 18E
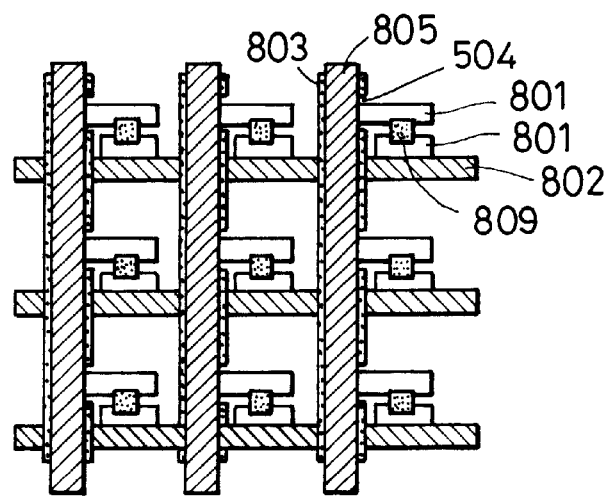
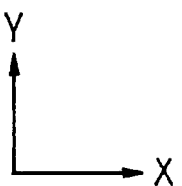

OFFSET PRINTING METHOD AND OFFSET PRINTING APPARATUS

BACKGROUND OF THE INVENTION

1. Field of the Invention

The present invention relates to a printing technique suitable for forming high-precision patterns for image forming device parts, printed circuit boards, etc., and particularly relates to an offset printing method and offset printing apparatus suitable for plate-shaped work such as large-area glass plates, epoxy plates, and so forth.

2. Description of the Related Art

Conventionally, the screen printing method has been known as a method used for forming patterns by printing on plate-shaped work such as glass plates, epoxy plates, and so forth, for electronic industry purposes. Also, a supporting structure for the screen thereof has been proposed as the method disclosed in Japanese Patent Laid-open Publication No. 1-182047.

However, in recent years, high-precision patterns for color filter substrates and circuit boards for image forming devices have come to require resolution of 50 μm and smaller, and thus the offset printing method has come into use. Regarding the type of offset printing method, the work is a flat plate, so flatbed proof press types are normally used. Also, recently, liquid crystal displays from 2 to 20 inches in size, and wall-type TVs 30 to 60 inches in size have come to greatly vary image forming apparatuses. Accordingly, large-size offset printers capable of dealing with large work sizes have come into need. Incidentally, recent patent publications (i.e., Japanese Patent Laid-open Publication No. 5-169622, Japanese Patent Laid-open Publication No. 6-171062, and Japanese Patent Laid-open Publication No. 7-125179) also disclose an offset printing method which differs in form from those used so far. The publications describe using an ink sheet (blanket) supported in the form of a flat plate.

However, with conventional offset printers which contain flatbed proof presses, the area of the plate surface table 701 and work surface table 702, shown in FIG. 20, must be increased in order to deal with large work sizes. In addition, the sideways width and diameter of the blanket drum 703 for mounting the blanket 704 also have to be increased. Further, the nip width 707 formed by the blanket 704 coming in contact with the plate 705 or the work 706 during printing must necessarily increase along with the increase in the diameter of the blanket drum 703, even if the printing pressure (amount of depressing) conditions are the same. Accordingly, the amount of deformation of the surface rubber on the blanket 704 increases, causing the problem of deterioration in printing pattern form. Further, the apparent approach angle "α" and the departing angle "β" formed by the blanket 704 coming in contact with the plate 705 or the work 706 during printing decreases as the diameter of the blanket drum 703 increases, and thus, there is the problem in that the reception and transfer of ink becomes unstable.

With the offset printing method disclosed in Japanese Patent Laid-open Publication No. 5-169622, Japanese Patent Laid-open Publication No. 6-171062, and Japanese Patent Laid-open Publication No. 7-125179, wherein an ink sheet (blanket) supported in a flat plate form is used, it is thought that the above problem of deterioration in printing pattern form can be avoided. However, the ink sheet (blanket) is fixed to a frame, so the approach angle "a" and the departing angle "b" cannot be set very large, and further it becomes impossible to maintain both the approach angle "a" and the departing angle "b" at appropriate angles from the point of beginning printing to the end thereof, and accordingly the problem of unstable ink reception and transfer still remains. In addition to this, the edges of the ink sheet (blanket) perpendicular to the printing direction are also fixed to the frame, so irregularities in tension are generated between the center portion and the perimeter portions at the time of printing, and in the event that the pressuring conditions at the time of ink reception and at the time of transfer differ, this causes a problem of deterioration in printing position precision.

SUMMARY OF THE INVENTION

The present invention has been made in light of the above, and it is an object thereof to provide an offset printing method and offset printing apparatus capable of securing excellent pattern form, ink receiving/transferring properties, and positional precision, for large plate-shaped work, as well.

That is, according to a first aspect of the present invention, an offset printing method comprises the steps of: a process for suspending a sheet-shaped or belt-shaped blanket by supporting both ends thereof at the leading and trailing ends thereof in the printing direction; and a process for performing ink reception from a plate to the blanket and also transferring ink from the blanket to a work, by pressing the blanket by a pressuring jig from an upwards direction down onto a plate or work situated below and sweeping in the printing direction.

Also, according to a second aspect of the present invention, an offset printing method comprises the steps of: a process for suspending a sheet-shaped or belt-shaped blanket by supporting both ends thereof at the leading and trailing ends thereof in the printing direction; a process for performing ink reception from a plate to the blanket and also transferring ink from the blanket to a work, by pressing the blanket by a pressuring jig from an upwards direction down onto a plate or work situated below and sweeping in the printing direction; and a process for correcting the amount of error in printing dimensions which occur at the time of the ink reception or the ink transferring, by moving the printing surface table by an appropriate value at the time of the ink reception or the ink transferring.

Also, according to a third aspect of the present invention, an offset printing method comprises the steps of: a process for suspending a sheet-shaped or belt-shaped blanket by supporting both ends thereof at the leading and trailing ends thereof in the printing direction; a process for performing ink reception from a plate to the blanket and also transferring ink from the blanket to a work, by pressing the blanket by a pressuring jig from an upwards direction down onto a plate or work situated below and sweeping in the printing direction; and a process for sequentially feeding an area used for the ink reception and transfer every certain arbitrary number of printing times.

Also, according to a fourth aspect of the present invention, an offset printing method comprises the steps of: a process for suspending a sheet-shaped or belt-shaped blanket by supporting both ends thereof at the leading and trailing ends thereof in the printing direction; a process for performing ink reception from a plate to the blanket and also transferring ink from the blanket to a work, by pressing the blanket by a pressuring jig from an upwards direction down onto a plate or work situated below and sweeping in the printing direction; and a process for controlling each of the tensions of the blanket divided by the pressuring jig, either at one end of the blanket or at both ends thereof.

Also, according to a fifth aspect of the present invention, an offset printing apparatus has a blanket for receiving ink from a plate and transferring the ink to a work, and supporting members for the blanket; wherein the blanket is sheet-shaped or belt-shaped, and the blanket supporting members are two opposing shafts extending vertically with respect to the printing direction and the leading and trailing ends of the printing direction, for suspending the blanket by supporting both ends thereof; and wherein the offset printing apparatus further comprises a pressuring jig for pressing the blanket from an upwards direction down onto a plate or work situated below and sweeping in the printing direction.

Also, according to a sixth aspect of the present invention, an offset printing apparatus has a blanket for receiving ink from a plate and transferring the ink to a work, and supporting members for the blanket; wherein the blanket is sheet-shaped or belt-shaped, and the blanket supporting members are two opposing shafts extending vertically with respect to the printing direction and the leading and trailing ends of the printing direction, for suspending the blanket by supporting both ends thereof; and wherein the offset printing apparatus further comprises:

a pressuring jig for pressing the blanket from an upwards direction down onto a plate or work situated below, band sweeping in the printing direction; and means for moving the printing surface table.

Also, according to a seventh aspect of the present invention, an offset printing apparatus has a blanket for receiving ink from a plate and transferring the ink to a work, and supporting members for the blanket; wherein the blanket is sheet-shaped or belt-shaped, and the blanket supporting members are two opposing shafts extending vertically with respect to the printing direction and the leading and trailing ends of the printing direction, for suspending the blanket by supporting both ends thereof; and wherein the offset printing apparatus further comprises:

a pressuring jig for pressing the blanket from an upwards direction down onto a plate or work situated below, and sweeping in the printing direction; and a mechanism for sequentially feeding the area of the blanket used for the ink reception and transfer every certain arbitrary number of printing times.

Also, according to an eighth aspect of the present invention, an offset printing apparatus has a blanket for receiving ink from a plate and transferring the ink to a work, and supporting members for the blanket; wherein the blanket is sheet-shaped or belt-shaped, and the blanket supporting members are two opposing shafts extending vertically with respect to the printing direction and the leading and trailing ends of the printing direction, for suspending the blanket by supporting both ends thereof; and wherein the offset printing apparatus further comprises:

a pressuring jig for pressing the blanket from an upwards direction down onto a plate or work situated below, and sweeping in the printing direction; and means for adjusting the tension of the blanket.

Also, according to a ninth aspect of the present invention, an offset printing apparatus has a blanket for receiving ink from a plate and transferring the ink to a work, and supporting members for the blanket; wherein the blanket is sheet-shaped or belt-shaped, and the blanket supporting members are two opposing shafts extending vertically with respect to the printing direction and the leading and trailing ends of the printing direction, for suspending the blanket by supporting both ends thereof; and wherein the offset printing apparatus further comprises a pressuring jig for pressing the blanket from an upwards direction down onto a plate or work situated below on a printing surface table, and sweeping in the printing direction; and wherein the supporting members are supporting structures movable in the printing direction.

Also, according the tenth aspect of the present invention, an offset printing apparatus has a blanket for receiving ink from a plate and transferring the ink to a work, and supporting members for the blanket; wherein the blanket is sheet-shaped or belt-shaped, and the blanket supporting members are two opposing shafts extending vertically with respect to the printing direction and the leading and trailing ends of the printing direction, for suspending the blanket by supporting both ends thereof; and wherein the offset printing apparatus further comprises a pressuring jig for pressing the blanket from an upwards direction down onto a plate or work situated below, and sweeping in the printing direction; and wherein the pressuring jig comprises a roller for pressing the blanket.

BRIEF DESCRIPTION OF THE DRAWINGS

FIG. 8 is a schematic side view showing the offset printing apparatus used with a fifth embodiment;

FIG. 9, including

FIG. 10 is a schematic side view showing the offset printing apparatus used with a seventh embodiment;

FIG. 18, including FIGS. 18A, 18B, 18C, 18D and 18E, is a diagram for describing the manufacturing process for an electron source according to the thirteenth embodiment;

DETAILED DESCRIPTION OF THE PREFERRED EMBODIMENTS

Figure 1:
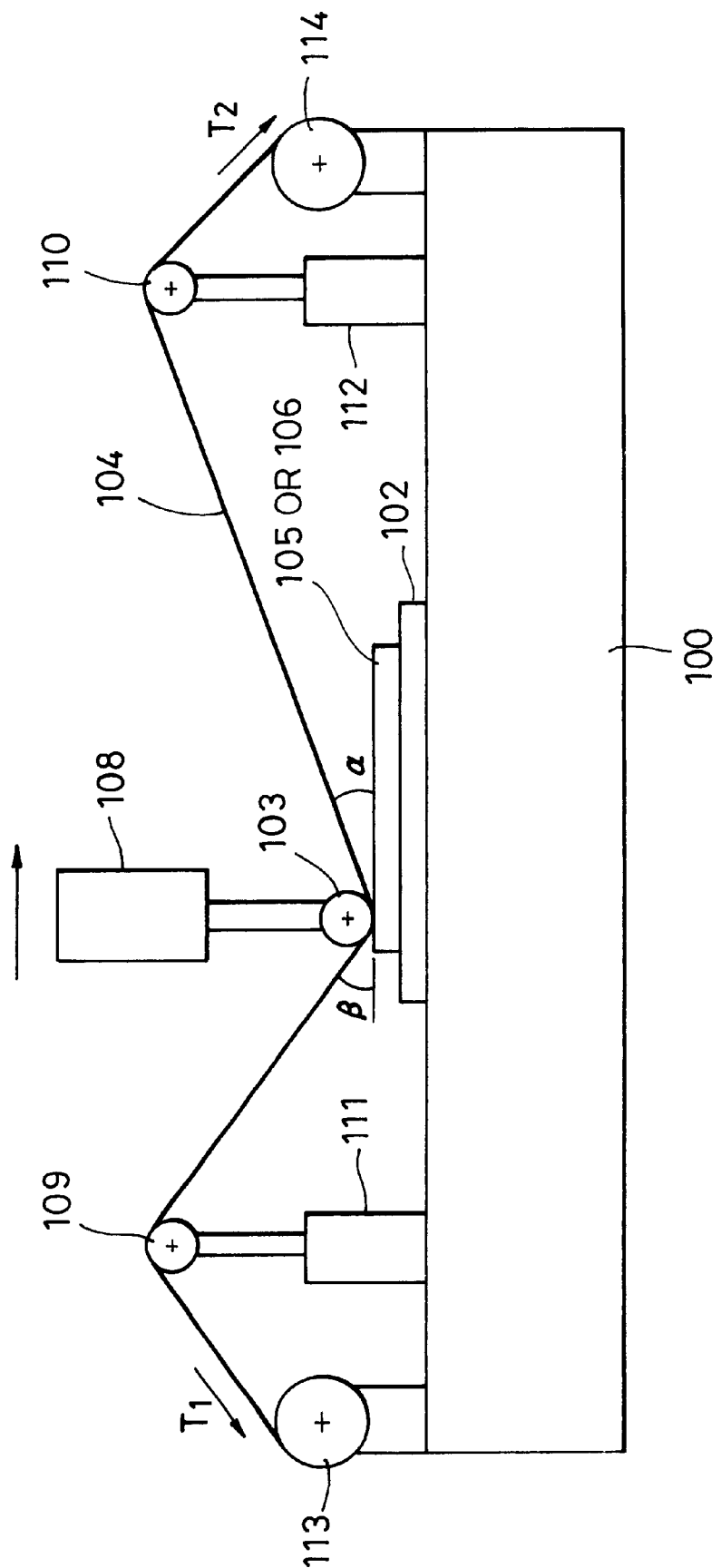
FIG. 1 is a schematic side view showing the offset printing apparatus used with a first embodiment.

The offset printing method according to the present invention comprises the steps of: a process for suspending a sheet-shaped or belt-shaped blanket by supporting both ends thereof at the leading and trailing ends thereof in the printing direction; and a process for performing ink reception from a plate to the blanket and also transferring ink from the blanket to a work, by pressing the blanket by a pressuring jig from an upwards direction down onto a plate or work situated below and sweeping in the printing direction.

With the above offset printing method according to the present invention, it is preferable that both of the supporting members for the blanket are capable of applying tension to the blanket and are supporting structures movable in a direction parallel to the printing direction.

Also, the offset printing apparatus according to the present invention has a blanket for receiving ink from a plate and transferring the ink to a work, and supporting members for the blanket; wherein the blanket is sheet-shaped or belt-shaped, and the blanket supporting members are two opposing shafts extending vertically with respect to the printing direction and the leading and trailing ends of the printing direction, for suspending the blanket by supporting both ends thereof; and wherein the offset printing apparatus further comprises a pressuring jig for pressing the blanket from an upwards direction down onto a plate or work situated below and sweeping in the printing direction.

With the above offset printing apparatus according to the present invention as well, it is preferable that both of the two supporting shafts for the blanket are capable of applying tension to the blanket and are supporting structures movable in a direction parallel to the printing direction.

Also, with the above offset printing method and offset printing apparatus according to the present invention, it is preferable that the approach angle α between the blanket and the plate or work surface, and the departing angle β thereof, be controlled so as to be at respective arbitrary constant angles from the beginning of printing to the end thereof, preferable such that $5° \leq α \leq 60°$ and $5° \leq β \leq 60°$ hold.

Also, it is preferable that the mechanical percentage of elongation of the blanket used in the above invention be 3% or less in the printing direction, under a load of 1,000 Kg/1 m width.

The invention described above enables a sheet-shaped or belt-shaped blanket to be suspended or stretched with two supporting points at both edges of the printing apparatus (i.e., the front and rear edges thereof in the printing direction), an appropriate approach angle α and departing angle β maintained with the plate or work surface below, and offset printing to be performed using a pressuring jig with an appropriate tip form from the rear face of the blanket. Accordingly, a suitable pattern form and suitable ink reception/transfer properties can be ensured over the entire printing surface, and further, these advantages do not change even with larger work sizes or large printing apparatuses.

Also, both edges of the blanket parallel with the printing direction are free, so there are no irregularities in tension in the width direction of the blanket at the time of pressed printing, thus yielding suitable printing with little positional precision irregularities within the printing face.

Also, with any of the above printing methods or any of the above printing apparatuses according to the present invention, it is preferable that the amount of error in printing dimensions which occur at the time of the ink reception or the ink transferring by the blanket be corrected, by moving the printing surface table by an appropriate value at the time of reception or transferring.

Now, it is preferable that the amount of shifting at relative positions between the blanket and original plate be measured at the time of ink reception, or that the amount of shifting at relative position between the blanket and work be measured at the time of transferring ink, thereby detecting the aforementioned amount of error in printing dimensions at the time of ink reception of transferring ink, wherein the amount of error thus detected in printing dimensions at the time of ink reception and at the time of transferring ink is corrected preferably by moving the printing surface table by appropriate values at the time of the ink reception and at the time of the ink transferring, or wherein the amount of error in printing dimensions at the time of ink reception and the amount of error in printing dimensions at the time of transferring ink are added and computed and correction is made by moving the printing surface table by an appropriate value at the time of the ink transferring, thereby correcting the printing dimensions.

Also, the timing for performing correction of the amount of error in printing dimensions is preferably carried out at the time of receiving ink, or at the time of transferring ink, or at both the time of receiving ink and the time of transferring ink before the printing operation, or by an arrangement wherein position detecting means compute a correction value concurrently with the printing operation in the printing direction and drives the surface table by an appropriate value.

Here, regarding the above-described printing surface plate driving method, for example, servo motors, pulse motors, and the like are preferred, but high-precision controlled air cylinders, hydraulic cylinders, or the like, will suffice. As for the means for detecting the position of the ink sheet (blanket), laser position sensors, linear gauges and the like are preferred, but pulses from a pulse motor or the like may be used. Also, a programmable controller is suitable for the computation processing device for the position detecting means, preferably having response control properties of 1 msec or lower, a data conversion format of 16 bits or higher, and memory functions.

As described above, further providing the present invention with the above correction process or correction mechanism yields further advantages of enabling suitable pattern form and highly-precise printing dimension precision to be maintained, without loosing reception and transferring properties over the entire face even in the event that offset printing of a wide pattern area is performed on a flat plate-shaped work of a large size.

Also, with any of the above printing methods or any of the above printing apparatuses according to the present invention, it is preferable to comprise a mechanism for sequentially feeding an area used by the blanket for the ink reception and transfer every certain arbitrary number of printing times. Having such a mechanism allows a fresh blanket surface to be constantly used for printing at all times.

An even more preferable form of the invention has a mechanism for refreshing the blanket surface, by removing with the application of heat ink solvent contained in the blanket which has been sequentially fed following printing, and/or a mechanism for cooling the thermally-refreshed blanket to room temperature.

Also, with the above-described invention, the surface rubber used for the blanket is preferably silicone rubber.

Also, any of the above offset printing methods or any of the above printing apparatuses preferably are arranged so as to control each of the tensions of the blanket divided by the pressuring jig, either at one end of the blanket or at both ends thereof, or preferably comprise a control mechanism for the tension, thus enabling correction of each amount of error in printing dimensions generated at the time of receiving and transferring ink by controlling the tension.

Also, the above tension control is preferably performed by detecting the tensions of the blanket divided by the pressuring jig, and changing each of the tensions of the blanket divided by the pressuring jig, based on that information (i.e., the detection results).

A preferable embodiment involves load cells detecting the tension of the blanket supporting portions in an independent manner right and left, and controlling the blanket tension to set values by a driving system such as servo motors or air cylinders, via a sequencer, thereby taking change in behavior equally for both reception and transfer, consequently realizing high dimensional precision of printed material.

Incidentally, appropriate values can be obtained from correlation equations between the blanket tension and change in the pattern, by performing printing experiments beforehand, and performing printing with these values set beforehand as printing conditions allows high-precision printing patterns to be obtained.

Figure 9A:
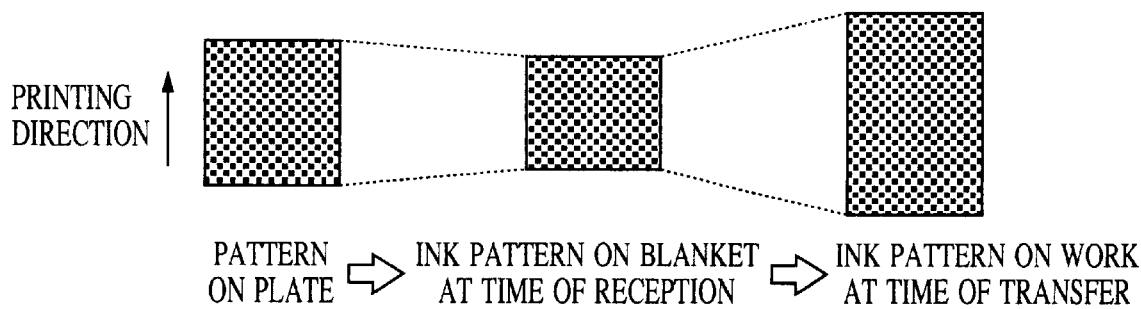
FIGS. 9A, 9B and 9C, is a diagram describing the difference on ink patterns depending on the difference in tension of the blanket.

Now, in the event that an offset printing apparatus such as shown in FIG. 1, which will be described later, is used to perform printing while equal tension (T1 and T2 in FIG. 1) is placed on the blanket at the time of printing, i.e., in the event that T1=T2 is maintained at both the time of receiving and transferring in the course of printing, there are cases wherein the generated printed materials differ in printing dimensions from the intended printing dimensions which were designed. This is due to the fact that there are cases wherein, as shown in FIG. 9A, the pattern on the plate is reduced to an ink pattern on the blanket at the time the blanket obtains the pattern from the printing plate at the time of reception, and is enlarged into an ink pattern on the work at the time of transfer, wherein the ink pattern is transferred onto the work to be printed upon. This mainly is due to a blanket shifting phenomenon owing to compression and expansion coming from the rubber elasticity of the blanket at the lower portion of the printing pressuring roller, at the time of the printing pressuring roller's movement. This shifting phenomena is affected by friction between the blanket and the object to be printed upon, such as glasswork for example, and behavioral differences in the friction coefficients at the plate at the time of reception, wherein there is widespread existence of ink, and at the work at the time of transfer, wherein the amount of ink is small. There are cases wherein the dimensions of the printed material shifts away from the designed dimensions, due to the printing dimensions changing at the time of ink reception and the time of ink transfer, owing to this behavioral difference.

Performing the above tension control in the present invention is further preferable, since the shifting of printing dimensions such as shown in FIG. 9A can be markedly suppressed, and even higher precision for printing dimensions can be realized.

Figure 9B:
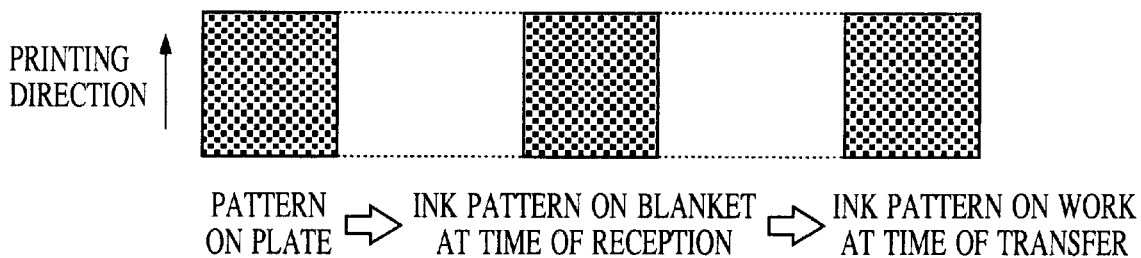

Regarding this tension control, the blanket tension at the left and right maybe set beforehand such that the pattern is equal both in the state of reception and in the state of transfer. In that event, as shown in FIG. 9B, the ink pattern on the blanket at the time of reception, wherein the blanket receives an ink pattern from the printing plate, and the ink pattern on the work which is the material upon which printing is to be performed at the time of reception, wherein the work receives the ink pattern, are approximately the same pattern as the pattern on the plate, in the direction of printing.

Figure 9C:
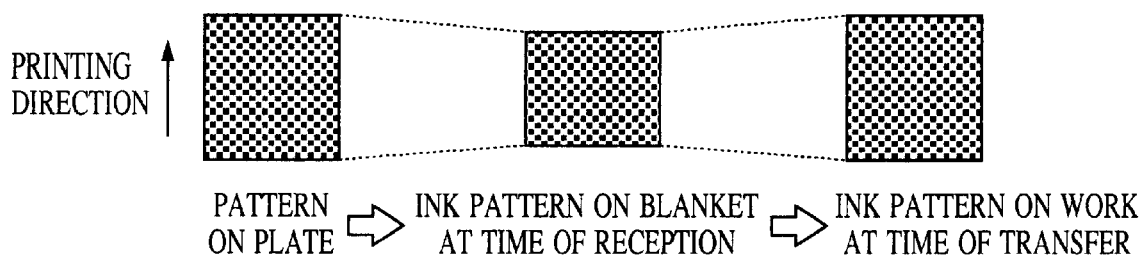

Also, the left and right tensions maybe individually controlled only at the time of transfer so as to produce an equal pattern at the time of transfer. In that even, as shown in FIG. 9C, the ink pattern on the blanket at the time of reception, wherein the blanket receives the ink pattern from the printing plate, is reduced in size, and the ink pattern on the work which is the material upon which printing is to be performed at the time of reception, wherein the work receives the ink pattern, is enlarged, and thus becomes equal to the pattern on the plate.

Also, any of the above printing methods or any of the above printing apparatuses preferably are arranged so that the supporting members supporting both ends of the blanket are movable in the printing direction, or so as to comprise such a movable mechanism, thus allowing the positions of the supporting members to be controlled such that the difference in blanket movement between the time of the ink reception and time of the ink transfer can be canceled.

Now, it is preferable that the movable mechanism be a mechanism wherein the supporting portions of both ends move following printing, and also that the amount of movement can be arbitrarily controlled.

Also, it is preferable that the driving means for executing the movement of the sporting portions at both ends be controlled by a position detecting unit for detecting the position of the blanket, and a computation processing means for performing computation processing of correction values for correcting the amount of movement of the blanket.

Further regarding the timing for correcting the amount of movement of the blanket, it is preferable to perform driving so as to correct the amount of movement of the blanket at at least one of the ink reception time or ink transfer time, so that a predetermined amount of movement is realized, or to perform driving at the time of transfer by a value equal to the amount of movement obtained at the time of ink reception so as to make correction.

Here, the driving means executing the movement of the supporting portions for both ends preferably are servo motors, pulse motors, and the like are preferable, but high-precision controlled air cylinders or the like, will suffice, and the driving force thereof may be directly applied to the blanket supporting portions or have the driving force transferred by gears or belts.

As for the above-described position detecting unit for the amount of movement of the blanket, laser position sensors, linear gauges and the like are preferred, but pulses from a pulse motor or the like may be used. Also, a programmable controller is suitable for the computation processing means, preferably having response control properties of 100 $\mu$sec or lower, a data conversion format of 16 bits or higher, and memory functions. Further, regarding the controlling method, a controlling method wherein the amount of movement of the blanket obtained at the time of receiving ink is measured by the position detecting unit, and wherein this is matched at the time of transferring with the same driving force, is also effective. Of course, it goes without saying that the above control may be performed: only at the time of ink reception; or at the time of transfer; or at each.

As described above, enabling supporting members which support both ends of the blanket to move in the printing direction comprises a preferable embodiment, since this allows a high-precision offset printing method and offset printing device to be provided, wherein the amount of movement of the blanket is arbitrarily controlled at each of the times of reception of ink and transferring of ink, thereby doing away with the difference in the amount of blanket movement at the time of receiving ink and transferring ink, since there are no effects of difference in the amount of movement due to rolling friction existing between the blanket and plate or blanket and work, nor are there effects of the amount of action error which the machine has.

Also, any of the printing methods or any of the printing apparatuses according to the above invention preferably is further arranged so that the pressuring jig is controlled at least one of the ink reception time or ink transfer time, or comprises a control mechanism for this control. It is preferable for the pressuring jig to comprise a pressuring roller, and that rotational moving force is provided to the pressuring roller at the time of sweeping while pressing the blanket with the pressuring roller. Such control of the pressuring jig is capable of doing away with the difference of the amount in blanket movement at the time of receiving ink and at the time of transferring ink.

Also, control of the pressing jig is preferably performed either by: measuring beforehand the amount of movement of the blanket generated at the time of receiving ink and at the time of transferring ink, compiling a printing dimensions correction expression for rotational control with the pressuring roller which the pressuring jig has, and controlling the rotation of the pressuring roller by the driving system at at least one of the ink reception time or ink transfer time by the printing dimensions correction expression; or by detecting the amount of movement of the blanket generated at the time of receiving ink with sensors, calculating the difference in the amount of movement of the blanket between the time of receiving ink and at the time of transferring ink based on the detection data so that the printing dimensions are proper at the time of transferring ink, and controlling the pressuring roller which the pressuring jig has by the driving system.

According to a preferable arrangement, a position sensor is provided for obtaining the amount of movement of the blanket under various conditions, the amount of movement of the blanket is detected from the positional information, and the roller driving motor for driving the pressuring roller of the pressuring jig is controlled by the sequencer, thereby allowing the amount of movement of the blanket at the time of performing the desired printing, and consequently performing correction so as to do away with the difference in the amount of blanket movement at the time of receiving ink and at the time of transferring.

The above control of the pressuring jig deals with a wide variety of printing conditions, such as the approach angle of the pressuring roller on the blanket at the time of printing, the departing angle thereof, the feeding speed of the pressuring jig and depressing force thereof, the surface nature (rolling friction) between the blanket and the printing plate filled with ink, and other problems owing to change.

Further, this is a preferable embodiment which resolves problems in the difference in the amount of blanket movement which occurs even during repetitive ink receiving and transferring actions under the same conditions, due to factors such as change in surface nature (swelling of the blanket due to solvent in the ink, unevenness in the amount of residual ink on the surface of the printing plate filled with ink, and so forth), rigidity of the printing apparatus, assembly precision, etc., thereby yielding high precision for the dimensions of the printed material. Incidentally, there are methods for experimenting and calculating beforehand to obtain ideal blanket movement amounts from the printing conditions, and methods for making calculations based on the amount of blanket movement at the time of receiving ink and making corrections at the time of transferring ink.

Also, regarding any of the above printing methods or any of the above printing apparatuses according to the invention, there are basically no particular restrictions on the materials used for the blanket, but in order to increase and stabilize the driving force thereof with the pressuring roller by friction, a preferable blanket comprises a rubber material such as silicone rubber or acrylonitrile-butadiene rubber or the like layered on top at the contact face with the pressuring roller of the pressuring jig.

Also, while there are basically no particular restrictions on the materials used for the pressuring roller either, it is preferable to have a rubber coat such as a silicone rubber or acrylonitrile-butadiene rubber on the surface of the roller, and to further have a great surface coarseness on the surface thereof.

The above-described control of the pressuring jig having the pressuring roller comprises a preferable embodiment for the present invention, since correction can be performed on the amount of movement of the blanket so that the amount of movement is the same for the time of receiving ink and the time of transferring ink, by rotating the arbitrarily-rotatable pressuring roller faster or slower than the feeding speed of the pressuring jig at the time of printing, thereby reproducing the pattern with the same dimensions as that on the plate onto the blanket at the time of receiving ink and further on the work at the time of transferring, thereby doing away with stretching and shrinking of the pattern during printing, consequently achieving even higher printing dimensions precision.

Also, regarding any of the above printing methods or any of the above printing apparatuses according to the invention, it is further preferable for the blanket to be configured of two or more layers, including a supporting layer and surface layer. Here, the surface layer is a layer used for the receiving and transferring of the ink, and the supporting layer is a layer for supporting the strength of the surface layer.

Also, it is preferable that the blanket be rigid and not easily stretched by tension in the printing direction, but have an appropriate degree of compressibility regarding force in the direction of applying pressing. From this perspective, it is preferable that the supporting layer of the blanket have a Young's modulus of 200 kg/mm$^2$ or greater in the printing direction, and that the stress generated at the time of compressing by 0.1 mm from the rear side of the blanket be within the range of 0.02 kgf/mm$^2$ to 0.5 kgf/mm$^2$.

Also, in order to provide the blanket with such mechanical properties, it is preferable to use a supporting layer of high-strength films such as polyester (PET), polyamide (PA), polyimide (PI) or the like, or rolled metal sheeting such as stainless steel or the like, and further to form an ink receiving-transferring layer of silicone rubber or the like, with a material layer introduced therebetween having compressibility, such as sponge or the like.

Using the blanket such as described above also yields further advantages for the present invention, in that suitable pattern form and highly-precise printing dimension precision can be maintained, without losing reception and transferring properties over the entire face even in the event that offset printing of a wide pattern area is performed on a flat plate-shaped work of a large size.

DETAILED DESCRIPTION OF THE PREFERRED EMBODIMENTS

The following is a detailed description of the present invention, with reference to the preferred embodiments.

First Embodiment

Figure 2:
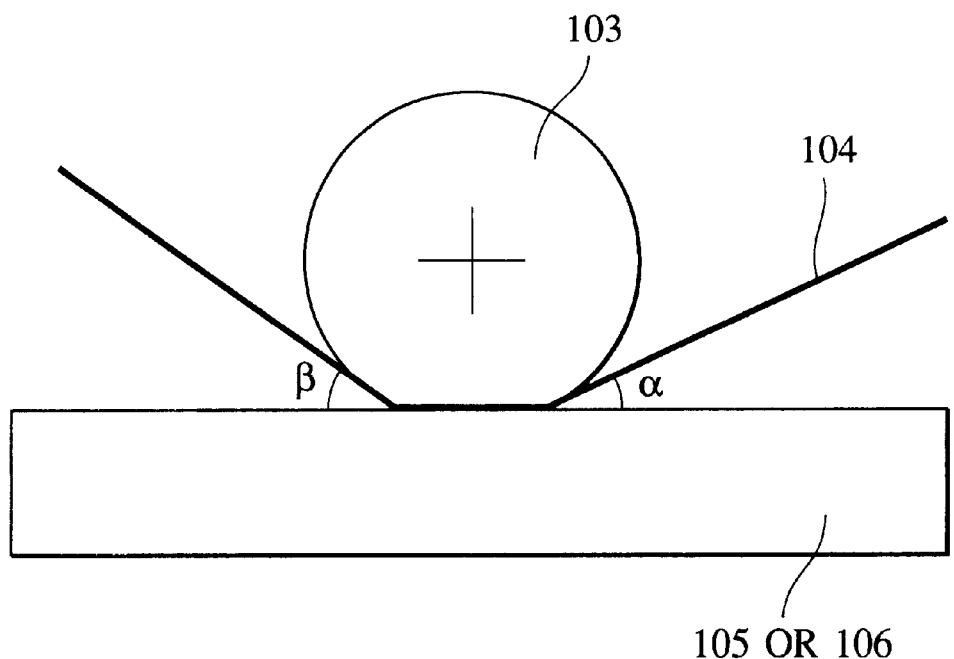
FIG. 2 is an enlarged diagram of the point of contact between the blanket and work, from FIG. 1.

The first embodiment will be described with reference to FIGS. 1 through 3.

FIG. 1 is a side view illustrating the overview of one example of an offset printing apparatus according to the present embodiment. In that figure, reference numeral 100 denotes the main frame of the printing apparatus, 102 denotes the printing surface table, with a plate 105 placed on this surface table 102 in the event of performing ink reception, or a work 106 placed thereupon in the event of performing ink transfer, thereby performing the printing process.

Also, the blanket 104 is suspended above the printing surface table 102, by supporting rollers 109 and 110. The blanket is set facing downwards. At the time of printing, a pressuring roller 103 attached to the tip of the pressuring device 108 descends while pressing the rear plane of the blanket 104, and the surface of the blanket is pressed against the plate 105 or the work 106 with a certain depressing amount D, and on the other hand a certain amount of tension is applied to the blanket 104 by the tension devices 113 and 114 at both ends (at the leading and trailing ends thereof in the printing direction). Subsequently, printing is performed by the pressuring roller 103 moving from the left end of the plate 105 or work 106, to the right end thereof. At this time, the approach angle α and the departing angle β formed between the blanket 104 and the plate 105 or work 106 are maintained at a set arbitrary angle during the printing operation, by means of elevating devices 111 and 112 each automatically adjusting the height of the supporting rollers 109 and 110.

The above has been an overview of the configuration of an example of an offset printing apparatus according to the present embodiment; the following is regarding an offset printing method using this printing apparatus.

The specifications for the members used are as follows:

Blanket 104: Blanket with silicone rubber surface (web-form, 600 mm wide and 2000 mm long, 2.0 mm thick) (stretching rate: 1.5% under load of 1000 Kg/1 m width)

Plate 105: Glass intaglio plate (outer form: 500 mm wide by 400 mm long, 3.0 mm thick) (pattern area: 400 mm wide by 300 mm long)

Work 106: Soda-lime glass (outer form: 500 mm wide by 400 mm long, 3.0 mm thick)

Ink: Gold resinated paste (solvents contained: terpineol, BCA)

Pressing roller 103: Formed of steel (30 mm in diameter and 650 mm in width)

First, ink was applied to the glass intaglio plate 105, excess ink was removed with a doctor blade, this plate 105 was placed on the printing surface table 102, and the blanket surface was pressed against the plate 105 by bringing the blanket 104 onto the left end thereof and pressing the rear side of the blanket 104 with the pressuring roller 103. The depressing amount D for the blanket here was set at 0.1 mm. Next, 120 Kg of tension was placed on each of the blanket portions to the left and right of the pressing point, by the tension devices 113 and 114, the pressuring roller 103 was moved in the printing direction (toward the right) at a speed of 20 mm/sec, thereby receiving the ink of the plate 105 on the surface rubber of the blanket 104. The elevating devices 111 and 112 were used during this time to maintain the approach angle α between the blanket 104 and the plate 105 at 20°, and the departing angle β at 25°.

Next, the plate 105 on the printing surface table 102 was removed and replaced with the work 106, and in the same manner as above, the blanket surface was pressed against the work 106 by bringing the blanket 104 onto the left end of the work 106 and pressing the rear side of the blanket 104 with the pressuring roller 103. The depressing amount D for the blanket here was set at 0.1 mm. Next, 120 Kg of tension was placed on each of the blanket portions to the left and right of the pressing point, by the tension devices 113 and 114, the pressuring roller 103 was moved toward the right at a speed of 20 mm/sec, thereby transferring the ink on the surface rubber of the blanket 104 onto the work 106. During this time, the elevating devices 111 and 112 were used to maintain the approach angle α between the blanket 104 and the work 106 at 20°, and the departing angle β at 25°, as shown in FIG. 2. Incidentally, FIG. 2 is an enlarged diagram of the point of contact between the blanket 104 and work 105 in FIG. 1.

These procedures transferred the ink of the pattern on the plate 105 into the work 106 via the blanket 104, thus completing the offset printing according to the present embodiment.

Figure 3:
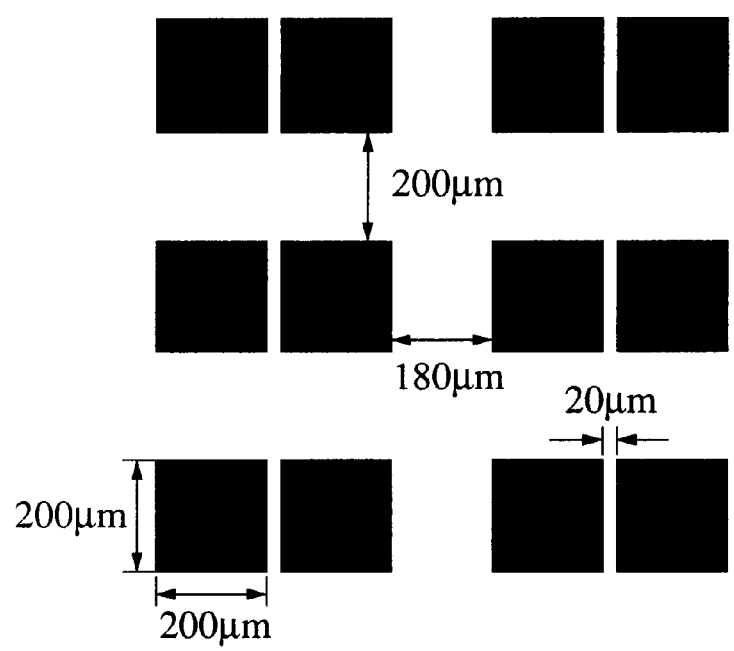
FIG. 3 is a diagram of the printing pattern array used with the first embodiment.

Incidentally, the printing pattern shown in FIG. 3 was used for the present embodiment. This pattern has true squares which are 200 $\mu$m square and arrayed in 200 $\mu$m intervals in the printing direction and in alternating 20 $\mu$m and 180 $\mu$m intervals in the width direction.

The pattern printed on the soda-lime glass work by the above embodiment was observed with a microscope, and there was absolutely no dropout or nicking of the pattern over the entire pattern area (400 mm by 300 mm) believed to be owing to defective reception or transfer of ink. Also, there were no pattern deformations which would indicate improper deformation of the blanket rubber, and the 20 $\mu$m pitch in the width direction was clearly separated and reproduced. Further, using an automatic measuring machine (manufactured by SOKKIA Co., Ltd.), the dimensions in the length direction were measured at 5×4=20 places in increments of 100 mm square, to verify the printing position precision. The results showed that the deviation was within ±10 $\mu$m at all places, meaning good positional precision.

With the above-described embodiment, an arrangement can be realized wherein a sheet-shaped or belt-shaped blanket is suspended or stretched with two supporting points at both edges of the printing apparatus (i.e., the front and rear edges thereof in the printing direction), an appropriate approach angle α and departing angle β are maintained with the plate or work surface below, and offset printing is performed using a pressuring jig with an appropriate tip form from the rear face of the blanket. Accordingly, a suitable pattern form and suitable ink reception/transfer properties can be ensured over the entire printing surface, and further, these advantages do not change even with larger work sizes or large printing apparatuses.

Also, both edges of the blanket parallel with the printing direction are free, so there are no irregularities in tension in the width direction of the blanket at the time of pressed printing, thus yielding suitable printing with little positional precision irregularities within the printing face.

Second Embodiment

The second embodiment will be described with reference to FIGS. 4 through 6.

Figure 4:
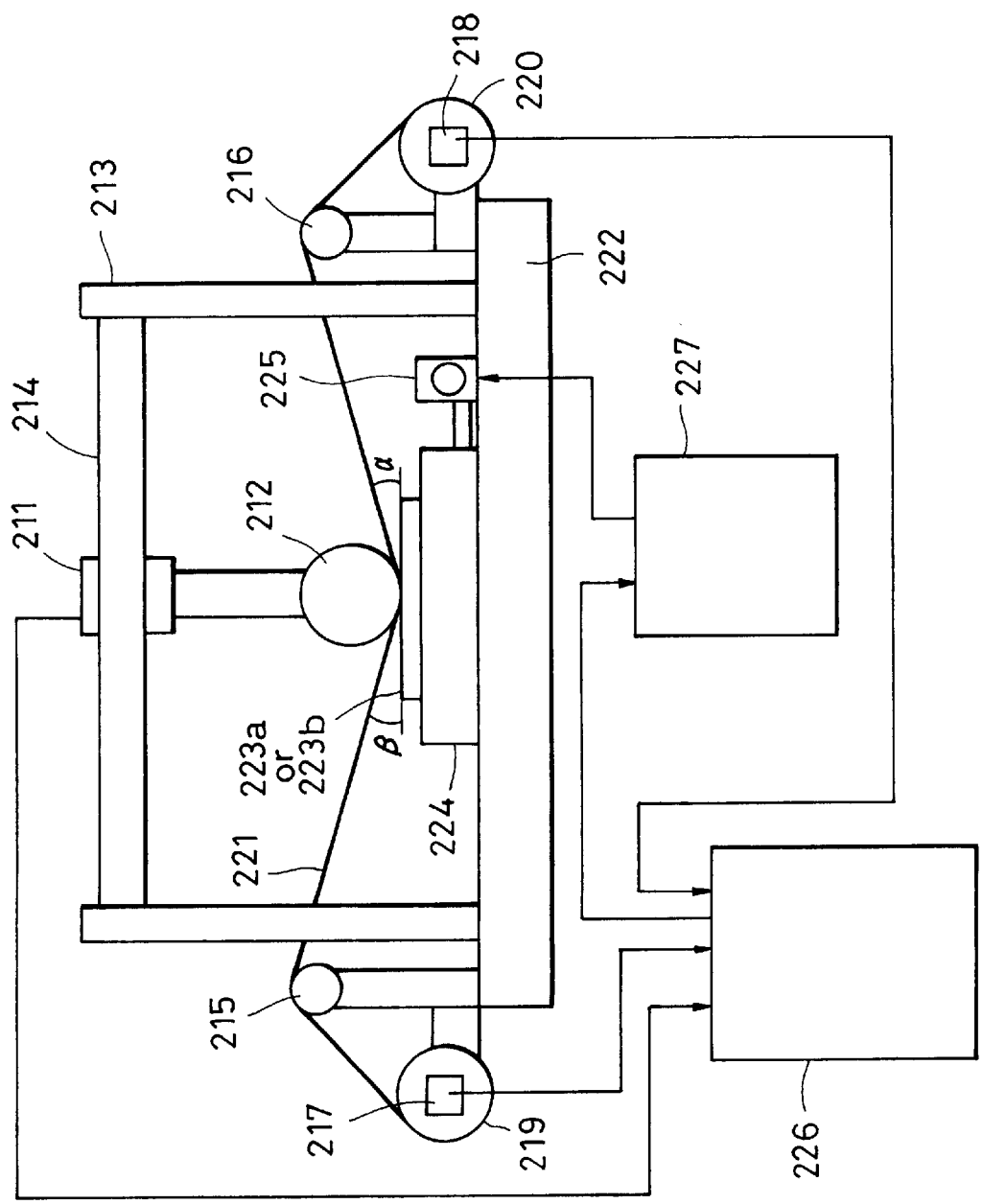
FIG. 4 is a schematic side view showing the offset printing apparatus used with a second embodiment.

FIG. 4 is a conceptual diagram of one example of an offset printing apparatus according to the present embodiment.

In FIG. 4, reference numeral 222 denotes the main frame of the printing apparatus, 224 denotes the printing surface table for placing the printing work, with a printing original plate 223a placed thereupon for transferring the ink on the plate to the blanket, following which a work 223b is placed thereupon for transferring of the ink on the blanket, and printing is performed. Also, the blanket 221 is suspended above the printing surface table 224, by supporting rollers 215 and 216, and the blanket is set facing downwards.

Also, reference numeral 211 denotes a pressuring device of a printing depressing amount setting unit with a position detecting unit built therein, 212 denotes a printing supporting roller, 213 denotes a post for supporting the printing supporting roller 212, 214 denotes a printing roller running guide for the printing supporting roller 212, 215 denotes a left-side elevation device, 216 denotes a right-side elevating device, 217 denotes a left-side blanket tension measuring device, 218 denotes a right-side blanket tension measuring device, 219 denotes a left-side blanket tension tensioning device, 220 denotes a right-side blanket tension tensioning device, 225 denotes a printing surface table driving device, 226 denotes a printing correction value computing device, and 227 denotes a printing surface table appropriate driving value processing device.

Also, though FIG. 4 illustrates an example wherein the blanket 221 is being wound by the left-side blanket tension tensioning device 219 and right-side blanket tension tensioning device 220, but in the event that the blanket 221 is formed of a material which is incapable of being wound, the tension tensioning devices can press the blanket 221 by the pressing rollers so that the tension is constant, and extract in a symmetrical manner.

At the time of printing with the offset printing apparatus according to the present embodiment, the pressuring supporting roller 212 attached to the tip of the pressuring device 211 containing a position detecting mechanism descends while pressing the rear side of the blanket 221, and first, the surface of the blanket is pressed against the plate 223a and receives the ink applied to the plate 223a, the plate 223a is then replaced with the work 223b and the same blanket 221 is pressed thereupon so that the ink which the blanket 221 has received is transferred onto the work 223b. At this time, the pressuring supporting roller 212 descends while pressing the rear side of the blanket 221. The blanket 221 is set against the plate 223a or work 223b, and is pressed with a depressing amount D. Subsequently, the pressuring roller 212 moves from the left edge of the plate 223a or work 223b to the right edge thereof, thus performing printing.

The above has been an overview of the configuration of an example of an offset printing apparatus according to the present embodiment; the following is directed to a printing method using this printing apparatus.

The offset printing apparatus shown in FIG. 4 was used, and actual printing was performed as described next.

(1) The blanket 221 used was a silicone rubber surface blanket (web-formed, 400 mm wide and 1500 mm long, 2.0 mm thick, stretching rate: 1.5% under load of 1000 Kg/1 m width).

(2) The plate 223a used was a glass intaglio plate (outer form: 350 mm wide by 300 mm long, 3.0 mm thick). The pattern area thereupon was 210 mm wide by 160 mm long.

(3) The work 223b used was a soda-lime glass plate (outer form: 350 mm wide by 300 mm long, 3.0 mm thick).

(4) The ink used was gold resinated paste (solvents contained: terpineol BCA)

(5) the pressuring roller 212 used was one formed of steel (35 mm in diameter and 450 mm in width).

Once the above members were prepared, first, ink was applied to the glass intaglio plate 223a, excess ink was removed with a doctor blade, the glass intaglio plate 223a was placed on the printing surface table 224, and the blanket surface was pressed against the glass intaglio plate 223a by bringing the blanket 221 onto the left end thereof and pressing the rear side of the blanket 221 with the pressuring roller 212. The depressing amount D for the blanket here was set at 0.1 mm. Next, 60 Kg of tension was placed on each of the blanket portions to the left and right of the pressing point, by the tension tensioning devices 219 and 220, the pressuring roller 212 was moved toward the right at a speed of 10 mm/sec.

At this time, the positional coordinates in the printing direction for every 1 mm, and the blanket tension values were computed by the computing device 226 based on the tension tensioning devices 219 and 220, and the pressuring device 211, the computation results were stored in the built-in storing means, and thus the ink was received on the surface rubber of the blanket 221.

At this time, the blanket supporting posts 215 and 216 were used to maintain the initial approach angle $\alpha$ of the blanket 221 as to the plate 223a at 25°, and the departing angle $\beta$ at 25°. Next, the glass intaglio plate 223a on the surface table 224 was removed and replaced with the work 223b, and in the same manner as above, the blanket surface was pressed against the work 223b by bringing the blanket 221 onto the left end of the work 223b and pressing the rear side of the blanket 221 with the pressuring roller 212. The depressing amount D for the blanket here was also set at 0.1 mm.

Next, 60 Kg of tension was placed on each of the blanket portions to the left and right of the pressing point, by the tension tensioning devices 219 and 220, the pressuring roller 212 was moved toward the right at a speed of 10 mm/sec, while at the same time the computing device 226 and surface table driving device 227 were operated so that a correction value was computed and output from the computing device 226 based on the above position information per 1 mm, the blanket tension information, and the blanket tension values at the above time of reception, and the surface table driving processing device 227 was operated to move the surface table in real-time by an appropriate value, so as to correct the printing dimensions to obtain proper dimensions, while the ink on the surface rubber of the blanket 221 was transferred into the work 223b.

These procedures transferred the ink of the pattern on the glass intaglio plate 223a onto the work 223b via the blanket 221, thus completing the offset printing according to the present embodiment.

Figure 5:
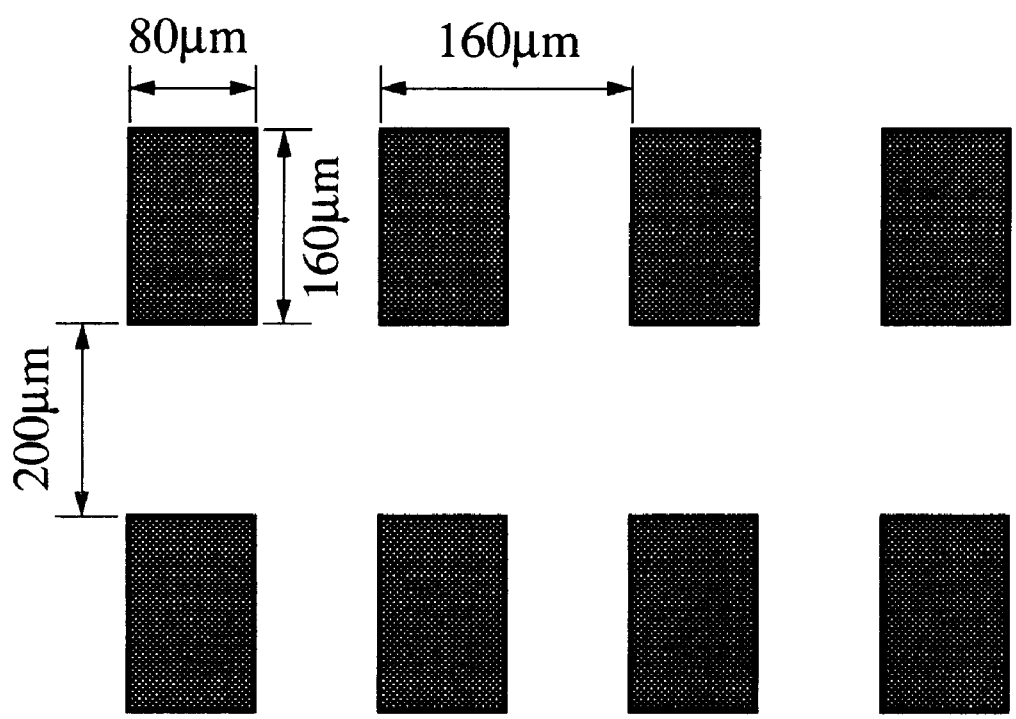
FIG. 5 is a diagram of the printing pattern array used with the second embodiment.

Incidentally, the printing pattern shown in FIG. 5 was used for the present embodiment. This pattern has rectangles of 160 $\mu$m by 80 $\mu$m arrayed in 200 $\mu$m intervals in the printing direction and at a 160 $\mu$m pitch in the width direction.

Figure 6:
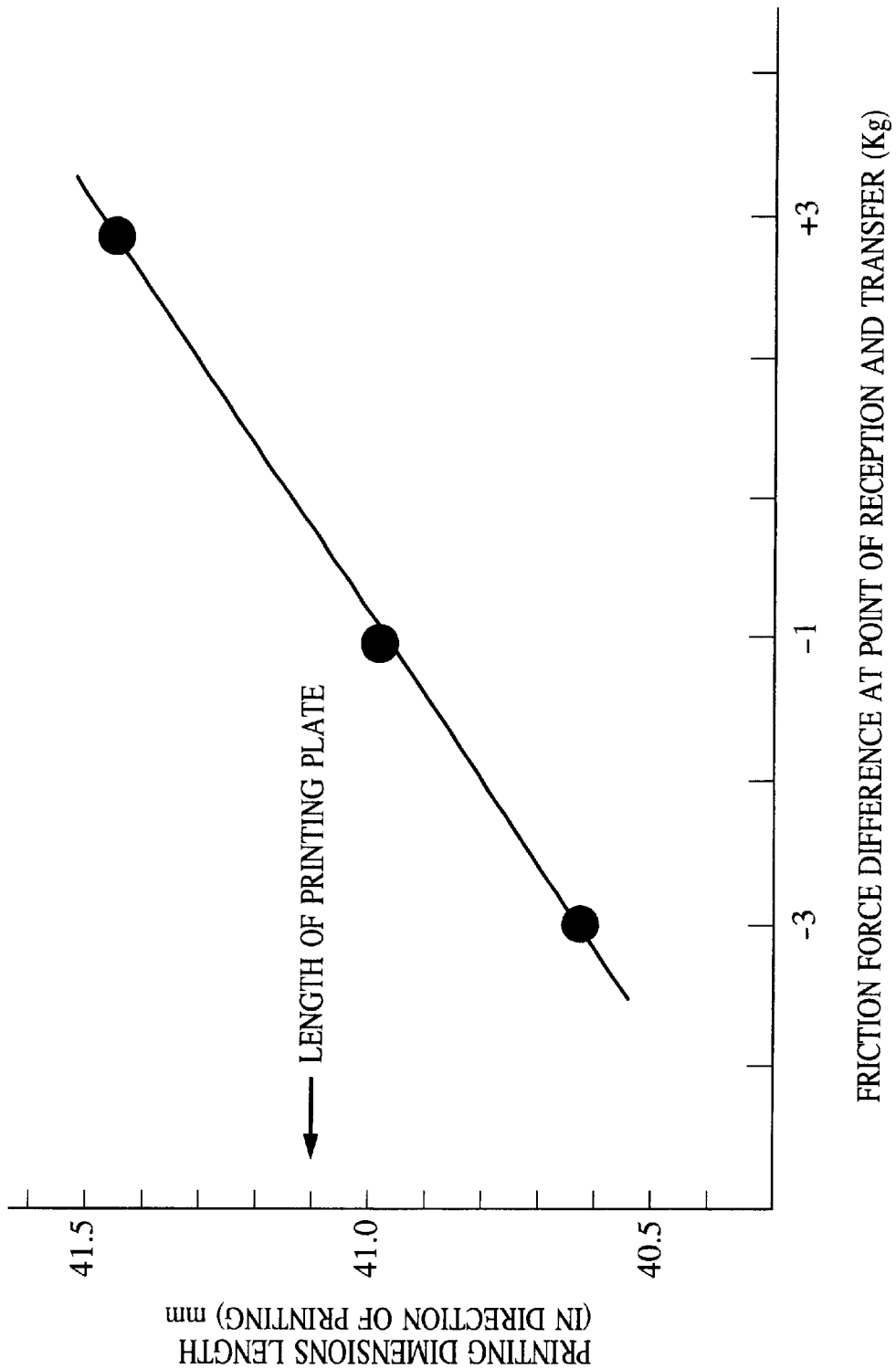
FIG. 6 is a correction graph created for use with the second embodiment.

Also, FIG. 6 shows a graph of the relation of the printing dimensions length corresponding to the difference in frictional force between the blanket, and the glass intaglio plate 223a and work 223b, at the time of receiving and transferring. This illustrates the proportional relationship wherein the greater the frictional force difference is, the greater the printing dimensions length can be made.

The pattern printed on the soda-lime glass work 223b by the present embodiment was observed with a microscope, and there was absolutely no dropout or nicking of the pattern over the entire pattern area (210 mm by 160 mm) believed to be owing to defective reception or transfer of ink. Also, there were no pattern deformations which would indicate improper deformation of the blanket 221 rubber, and the 200 µm pitch in the width direction was clearly separated and reproduced. Further, using a measuring microscope (manufactured by Nikon Corporation), the length of the outer form of the printing area was measured, to verify the printing precision. The results showed that the deviation was within ±10 µm for the entire length, meaning good positional precision.

Third Embodiment

While the above second embodiment performed correction in real-time every 1 mm, the present embodiment involves the appropriate value being input for driving the surface table which was calculated using the data at the time of reception by a correction expression and obtained beforehand from a correction value at the time of starting printing transfer, and printing was performed in the same manner. Subsequently, the length of the outer form of the printing area was measured using an automatic measuring microscope (manufactured by Nikon Corporation) in the same manner, yielding good positional printing precision. There was absolutely no dropout or nicking of the pattern over the entire pattern area (210 mm by 160 mm) believed to be due to defective reception or transfer of ink.

Also, there were no pattern deformations which would indicate improper deformation of the rubber of the blanket 221, and the 200 µm gap in the width direction was clearly separated and reproduced.

As described above, according to the second and third embodiments, suitable pattern form and highly-precise printing dimension precision can be maintained, without loosing reception and transferring properties over the entire face even in the event that offset printing of a wide pattern area is performed on a flat plate-shaped work of a large size, and similarly good printing can be performed even in the event that the work and pattern area grows even larger.

Fourth Embodiment

The fourth embodiment will be described with reference to FIG. 7.

Figure 7:
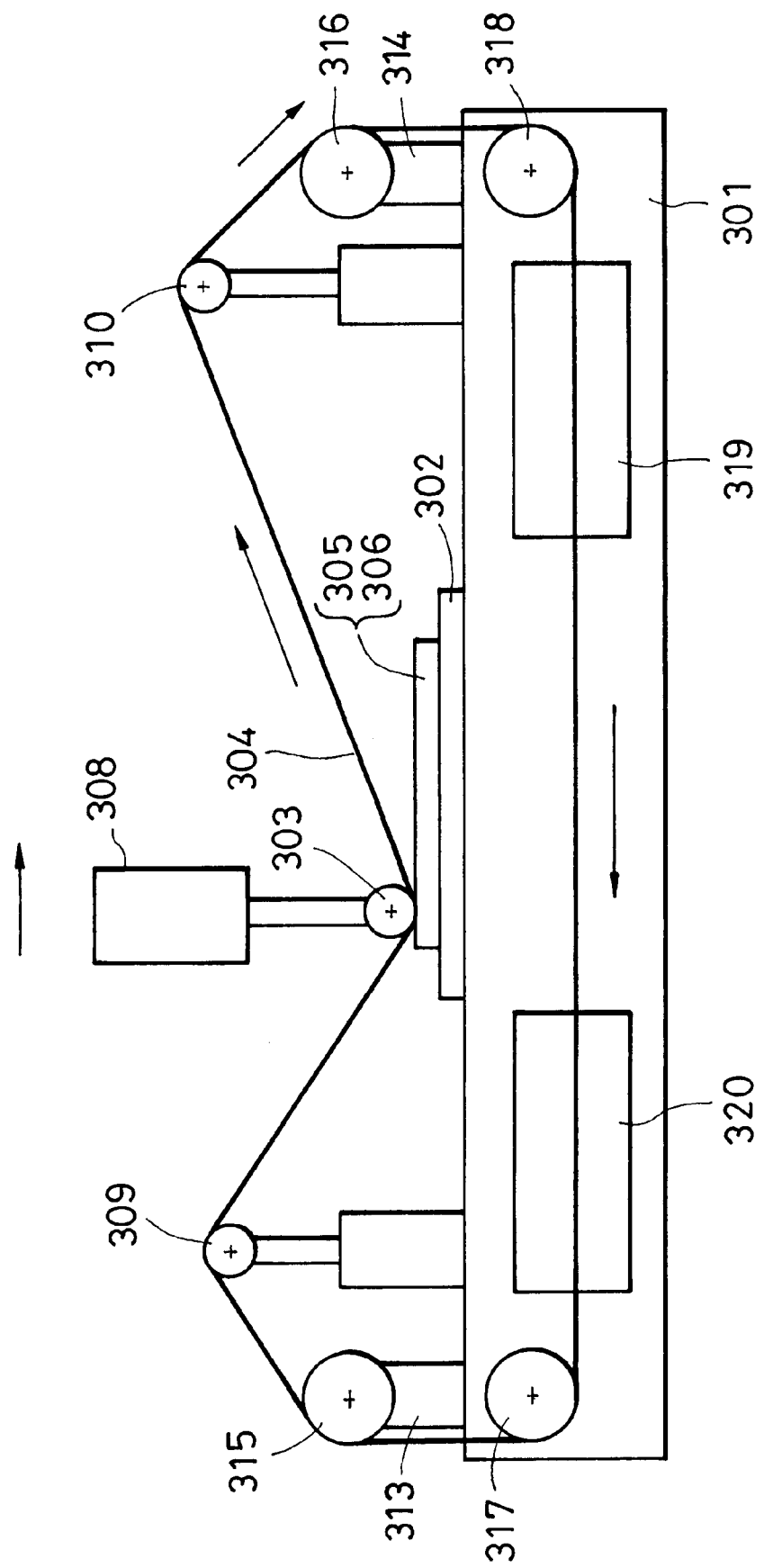
FIG. 7 is a schematic side view showing the offset printing apparatus used with a fourth embodiment.

FIG. 7 is a side view illustrating the overview of one example of an offset printing apparatus according to the present embodiment.

In FIG. 7, reference numeral 301 denotes the main frame of the printing apparatus, 302 denotes the printing surface table, with an offset printing plate 305 placed on this printing surface table 302 in the event of performing ink reception, and a work 306 thereupon in the event of performing ink transfer, thereby performing printing. Also, the sheet-shaped or belt-shaped blanket 304 is connected in a ring form so as to loop through the printing apparatus over the rollers 309, 310, 315, 316, 317, and 319, and is suspended above the printing surface table 302 by supporting rollers 309 and 310 so as to face downwards. Also, reference numeral 303 denotes a pressuring roller for pressing the blanket 304, 308 denotes a pressuring device for pressing the pressuring roller 304, 313 and 314 denote tension devices for adjusting the tension of the suspension tension rollers 315 and 316, 319 denotes a heating vat for heating the blanket 304, and 320 denotes a cooling vat for cooling the blanket 304 to room temperature.

At the time of printing, the pressuring roller 303 attached to the tip of the pressuring device 308 descends while pressing the rear plane of the blanket 304, and the surface of the blanket is pressed against the plate 305 or the work 306 with a certain depressing amount D, and on the other hand a certain amount of tension is applied to the blanket 304 by the vertical movement of the tension devices 313 and 314 at both ends thereof. Subsequently, the pressuring roller 303 moves from the left edge of the plate 305 or work 306 to the right edge thereof, thus performing printing. Further, this ring-shaped blanket 304 passes through the heating vat 319 and cooling vat 320 placed within the main frame 301 of the printing apparatus, such that when the above printing has been performed a predetermined number of times and the surface rubber of the blanket has absorbed a certain amount of solvent, the portion used for printing is tucked and fed, and placed in the heating vat 319, thereby removing the solvent by drying.

When the tucked feeding is performed again following the printing having been performed the predetermined number of times, the portion which had been in the heating vat 319 is then placed in the cooling vat 320, and cooled to room temperature. Thus, the portion of the blanket which has absorbed the solvent used for printing is regenerated to capabilities close to those before having been used, by means of passing through the heating vat 319 and the cooling vat 320, so the structure permits repeated use thereof for printing.

The above has been an overview of the configuration of an example of an offset printing apparatus according to the present embodiment; the following is directed to an offset printing method using this printing apparatus.

The printing apparatus shown in FIG. 7 was used to perform actual printing as follows.
(1) The blanket 304 used was a ring-shaped blanket with a surface of silicone rubber, 600 mm wide and 5000 mm long, and 2.0 mm thick. The surface silicone rubber blanket also had a stretching rate of 1.5% under load of 1000 Kg/1 m width.
(2) The offset printing plate 305 used was a glass intaglio plate (outer form: 500 mm wide by 400 mm long, 3.0 mm thick). The pattern area on the glass intaglio plate was 400 mm wide by 300 mm long.
(3) The work 306 used was a soda-lime glass plate (outer form: 500 mm wide by 400 mm long, 3.0 mm thick).
(4) The ink used was gold resinated paste (solvents contained: terpineol BCA)
(5) The pressuring roller 303 used was one formed of steel (30 mm in diameter and 650 mm in width).
(6) The temperature of the heating vat 319 was set at 110° C.
(7) The temperature of the cooling vat 320 was set at 23° C. with a wind speed of 3 m/sec.

Once the above members were prepared, first, ink was applied to the offset printing glass intaglio plate 305, excess ink was removed with a doctor blade, this plate 305 was placed on the printing surface table 302, and the blanket 304 at room temperature was pressed against the plate 305 at the left end thereof and pressing the rear side of the blanket 304 with the pressuring roller 303. The depressing amount D for the blanket here was set at 0.1 mm.

Next, 120 Kg of tension was placed on each of the blanket portions to the left and right of the pressing point, by the tension devices 313 and 314, the pressuring roller 303 was moved toward the right at a speed of 20 mm/sec, so the surface rubber of the blanket 304 received the ink.

Next, the plate 305 on the printing surface table 302 was removed and replaced with the work 306, and in the same manner as above, the blanket 304 was pressed against the work 306 at the left end thereof by pressing the rear side of the blanket 304 with the pressuring roller 303. The depressing amount D for the blanket 304 here was set at 0.1 mm. Next, 120 Kg of tension was placed on each of the blanket portions to the left and right of the pressing point, by the tension devices 313 and 314, the pressuring roller 303 was moved toward the right at a speed of 20 mm/sec, thereby transferring the ink on the surface rubber of the blanket 304 onto the work 306.

These procedures transferred the ink of the pattern on the plate 305 into the work 306 via the blanket 304, thus completing one offset print.

Following this, the work 306 was replaced again, and the same printing was repeated 10 times in succession. Each print required 3 minutes, so the total process required 30 minutes. Thus, 10 prints were made.

Now, the portion which had been used for receiving and transferring the ink during the printing was tucked and fed, and placed in the heating vat 319. Printing of prints 11 through 20 was performed using a new face of the blanket, but after 20 prints were made, this portion was tucked and fed in the same manner, and placed in the heating vat 319. At this time, the portion which had been placed in the heating vat 319 earlier (the portion which performed the first prints 1 through 10) was placed in the cooling vat 320, and printing of prints 21 through 30 was performed using a new face of the blanket 304. After 30 prints were made, this portion was tucked and fed in the same manner, but the portion of the blanket used for the subsequent 31 through 40 prints was the portion of the blanket used for the first 1 through 10 prints.

However, this portion has spent 30 minutes each in the heating vat 319 and cooling vat 320, so the solvent contained in the ink which had been absorbed into the surface rubber of the blanket was almost all gone, and the surface temperature of this portion was almost equal to the room temperature.

The above tucked feeding procedure according to the present embodiment was used to make 120 successive prints.

Incidentally, the printing pattern shown in FIG. 3 was used for the present embodiment. This pattern has true squares which are 200 $\mu$m square and arrayed in 200 $\mu$m intervals in the printing direction and in alternating 20 $\mu$m and 180 $\mu$m intervals in the width direction. The patterns printed on the 1st, 40th, 80th, and 120th works produced by the present invention were observed with a microscope, and there was absolutely no dropout or reduction in film thickness of the pattern over the entire pattern area (400 mm by 300 mm) believed to be owing to defective reception or transfer of ink. Also, there were no pattern deformations characteristic of swollen uplifting of the surface rubber of the blanket 304, and the 20 $\mu$m pitch in the width direction was clearly separated and reproduced.

FIRST COMPARATIVE EXAMPLE

Now, in order to verify the effects of the fourth embodiment, a continuous printing experiment was performed as a comparative example wherein 120 prints were made consecutively using the same place on the blanket for reference, but by the 40th sample, the 20 $\mu$m gap was already beginning to narrow, and after the 80th print, the reduction in the film thickness occurred leading to not 100% of the ink being transferred.

The results of the fourth embodiment and the first comparative example are shown in Table 1.

TABLE 1

| | | 1st | 40th | 80th | 120th |
|---|---|---|---|---|---|
| 20 $\mu$m gap | Present embodiment | 20.2 $\mu$m | 20.0 $\mu$m | 20.1 $\mu$m | 19.8 $\mu$m |
| | Comparative example 1 | 20.2 $\mu$m | 16.3 $\mu$m | 10.6 $\mu$m | contact |
| Film thickness ($\mu$m) | Present embodiment | 2.8 $\mu$m | 2.7 $\mu$m | 2.8 $\mu$m | 2.6 $\mu$m |
| | Comparative example 1 | 2.7 $\mu$m | 2.6 $\mu$m | 1.8 $\mu$m | 1.3 $\mu$m |

From this Table 1, it can be understood that the printing ink film thickness for the fourth embodiment is 2.6 $\mu$m at the 120th print, almost the same as the beginning, while with the first comparative example, this had deteriorated to 1.3 $\mu$m.

With the offset printing apparatus according to the above-described fourth embodiment, a sheet-shaped or belt-shaped blanket is formed into a seamless ring form and mounted for use, which is supported over the printing surface table by two opposing shafts positioned in a direction perpendicular to the printing direction, the face of the blanket is caused to face the plate face or the work face, and a pressured sweeping action is performed by a pressuring jig from the rear side of the blanket between the two supporting shafts, thereby performing receiving and transferring of ink. Subsequently, at the point that an arbitrary number of prints have been made, the used portion of the blanket is sequentially fed out, and a fresh blanket portion is used anew. At this time, the blanket portion which has been already used enters into a heating mechanism unit provided within the offset printing apparatus, the ink solvent contained in the blanket is heated and removed so that the blanket is refreshed, and then, this portion enters into a cooling mechanism unit provided within the offset printing apparatus, and is cooled to room temperature. Thus, the portion of the blanket which has already been used is completely refreshed and revived, so as to have printing capabilities the same as those of the unused blanket portions.

That is to say, with the offset printing apparatus according to the above fourth embodiment, the ring-shaped blanked is sequentially recycled through the states of printing→heating and drying→cooling→printing, thereby enabling continuous printing. Using an offset printing apparatus according to the present embodiment such as described above enables printing to be constantly performed with a good pattern form at 100% ink transfer rate, without removing the blanket from the apparatus for refreshing or temporarily shutting down printing. Consequently, the rate of operation of the apparatus improves, having great effects on reduction of the cost of printed materials.

Fifth Embodiment

The fifth embodiment will be described with reference to the drawings.

FIG. 8 is a side view illustrating the overview of one example of an offset printing apparatus according to the present embodiment.

In FIG. 8, reference numeral 401 denotes the surface table of the present offset printing apparatus, 402 denotes a plate or a work surface table, 403 denotes a printing plate applied with ink to be received, and 415 denotes the work to be printed upon, which is to be replaced with the printing plate 403. Reference numeral 404 denotes a blanket to receive ink from the printing plate 403 and transfer this to the work 415, 405 denotes a pressuring member for pressuring the rear side of the blanket 404, 406 denotes a pressuring device for pressuring the pressuring member, 407 and 408 denote elevating devices capable of adjusting the tension of the blanket 404, 409 and 410 denotes tension devices for maintaining the tension of the blanket 404 constant, 411 and 412 are pressure sensors for measuring the tension of the blanket 404, and 413 and 414 are supporting rollers for vertically moving by the elevating devices 407 and 408.

Now, the blanket 404 used for receiving and transferring ink is of a flat sheet or belt shape, is supported only by two shafts which are in a perpendicular direction to the printing direction of the blanket 404, and performs reception and transfer of ink by being swept by a pressuring roller 405 which is a pressuring jig for pressuring the blanket 404 between the two shafts.

In FIG. 8, the printing plate 403 is placed upon the plate surface table 402 for receiving ink, and the work 415 is placed thereupon for transferring of ink, thereby performing printing. Also, the blanket 404 is suspended above the printing surface table 402 by the supporting rollers 409 and 410, with the surface of the blanket facing downwards. At the time of printing, the pressuring roller 405 attached to the tip of the pressuring device 406 descends while pressing the rear side of the blanket 404, the surface of the blanket is pressed against the printing plate 403 or the work 415 at a set depressing amount D, and a constant tension is applied to the blanket 404 by the tension devices 409 and 410 which are at the left and right ends thereof. Subsequently, printing is performed by the pressuring roller 405 moving from the left end to the right end of the printing plate 403 or the work 415.

At this time, the approach angle α and the departing angle β formed between the blanket 404 and the plate 403 or work 415 can be maintained at an arbitrarily set angle during the printing operation, by the height of the supporting rollers 413 and 414 each being automatically adjusted by the elevating devices 407 and 408. Further, the blanket tensions T1 and T2 are detected in real-time by the lead cells 411 and 412 positioned at the blanket-supporting ends, and this information is fed back to the driving unit placed in the supporting unit, thus intentionally setting the blanket tension for the blanket to the right and left sides of the pressuring roller 405 during printing.

Now, description has so far been made regarding the overall configuration of an example of an apparatus capable of receiving ink from a printing plate 403 to a blanket which is under a constant tension, and transferring this onto a flat-plate work 415 that is the material to which printing is to be performed; a printing method using this offset printing apparatus will now be described.

The printing apparatus shown in FIG. 8 was used to perform actual printing as follows.

(1) The blanket 404 used was a blanket with a surface of silicone rubber. This blanket was of a web form 600 mm wide and 2000 mm long, and 2.0 mm thick with the stretching rate thereof being 1.5% under a load of 1000 Kg/1 m width.

(2) The printing plate 403 used was a glass intaglio plate (outer form: 500 mm wide by 400 mm long, 3.0 mm thick), the pattern area thereupon was 400 mm wide by 300 mm long.

(3) The work 415 used was a soda-lime glass plate (outer form: 500 mm wide by 400 mm long, 3.0 mm thick).

(4) The ink used was gold resinated paste (solvents contained: terpineol, BCA)

(5) The pressuring roller 405 used was one formed of steel (30 mm in diameter and 650 mm in width).

These members having been prepared, first, the relationship between the relational expression of tension of the blanket 404 and pattern change on the blanket 404 at the time of reception, and the change in pattern dimensions from the blanket 404 onto the work 415 at the time of transfer, was understood, and optimal blanket tension setting values for each of reception and transfer were obtained.

First, ink was applied to the glass intaglio plate serving as the plate 403, excess ink was removed with a doctor blade, this plate 403 was placed on the printing surface table 402, and the blanket surface was pressed against the plate 403 at the left end thereof and pressing the rear side of the blanket 404 with the pressuring roller 405. The depressing amount D for the blanket 404 here was set at 0.1 mm.

Next, tension was placed on each of the blanket portions to the left and right of the pressing point by the tension devices 409 and 410, such that the tension of the tension device 409 was set to 100 Kg and the tension of the tension device 410 was set to 110 Kg, the pressuring roller 405 was moved toward the right at a speed of 20 mm/sec, thereby receiving the ink on the surface rubber of the blanket 404, The elevating devices 407 and 408 were used during this time to maintain the approach angle α between the blanket 404 and the plate 403 at 20°, and the departing angle β at 25°.

Providing a tension difference of 10 Kg did away with shifting of the pattern received on the blanket 404 in the printing direction, and a pattern with approximately the same precision as that on the plate was received on the blanket.

Next, the plate 403 on the printing surface table 402 was removed and replaced with the work 415, and in the same manner as above, the blanket surface was pressed against the work 415 by bringing the blanket 404 onto the left end thereof and pressing the rear side of the blanket 404 with the pressuring roller 405. The depressing amount D for the blanket here was set at 0.1 mm. Next, the tension of the tension device 409 was set to 100 Kg and the tension of the tension device 410 was set to 105 Kg, the pressuring roller 405 was moved by the pressuring device 406 toward the right at a speed of 20 mm/sec, thereby transferring the ink on the surface rubber of the blanket 404 onto the work 415. During this time, the elevating devices 407 and 408 were used to maintain the approach angle α between the blanket 404 and the work 415 at 20°, and the departing angle β at 25°.

These procedures transferred the ink of the pattern on the plate 403 onto the work 415 via the blanket 404, thus completing the offset printing according to the present embodiment.

Incidentally, the printing pattern shown in FIG. 3 was used for the above-described present embodiment also. This pattern has true squares which are 200 μm square and arrayed in 200 μm intervals in the printing direction and in alternating 20 μm and 180 μm intervals in the width direction.

The pattern printed on the soda-lime glass work 415 by the present embodiment was observed with a microscope, and there was no dropout or nicking of the pattern over the entire pattern area (400 mm by 300 mm) believed to be owing to defective reception or transfer of ink. Also, there were no pattern deformations which would indicate improper deformation of the blanket 404 rubber, and the 20 μm pitch in the width direction was clearly separated and reproduced. Further, using an automatic measuring machine (manufactured by SOKKIA Co., Ltd.), the dimensions in the length direction were measured at 5×4=20 places in increments of 100 mm square, to verify the printing dimensions precision. The results showed that the deviation was within ±5 μm at all places, meaning good dimensional precision, as compared to the deviation of ±10 μm in cases of no blanket tension control.

Sixth Embodiment

With the present embodiment, the offset printing apparatus according to the fifth embodiment shown in FIG. 8 was used to perform printing as follows.

(1) The blanket 404 used was a blanket with a surface of silicone rubber. This blanket was of a web form 600 mm wide and 2000 mm long, and 2.0 mm thick with the stretching rate thereof being 1.5% under a load of 1000 Kg/1 m width.

(2) The printing plate 403 used was a glass intaglio plate (outer form: 500 mm wide by 400 mm long, 3.0 mm thick), and the pattern area thereupon was 400 mm wide by 300 mm long.

(3) The work 415 used was a soda-lime glass plate (outer form: 500 mm wide by 400 mm long, 3.0 mm thick).

(4) The ink used was gold resinated paste (solvents contained: terpineol, BCA)

(5) The pressuring roller 405 used was one formed of steel (30 mm in diameter and 650 mm in width).

These members having been prepared, first, ink was applied to the glass intaglio plate serving as the printing plate 403, excess ink was removed with a doctor blade, this plate 403 was placed on the printing surface table 402, and the blanket surface was pressed against the plate 403 at the left edge thereof and pressing the rear side of the blanket 404 with the pressuring roller 405. The depressing amount D for the blanket 404 here was set at 0.1 mm.

Next, tension was placed on each of the blanket portions to the left and right of the pressing point by the tension devices 409 and 410, with the tension of the tension devices 409 and 410 being set to 100 Kg, the pressuring roller 405 was moved toward the right at a speed of 20 mm/sec, thereby receiving the ink on the surface rubber of the blanket 404, The elevating devices 407 and 408 were used during this time to maintain the approach angle α between the blanket 404 and the plate 403 at 20°, and the departing angle β at 25°.

Since the blanket tension was set at the same for both left and right sides, the ink pattern transferred onto the blanket shrunk by around 2.0 mm as compared to the pattern dimensions of 400 mm in printing pattern width on the plate.

Next, the plate 403 on the printing surface table 402 was removed and replaced with the work 415, and in the same manner as above, the blanket surface was pressed against the work 415 by bringing the blanket 404 onto the left end thereof and pressing the rear side of the blanket 404 with the pressuring roller 405. The depressing amount D for the blanket here was set at 0.1 mm.

Next, tension was placed on each of the blanket portions to the left and right of the pressing point by the tension devices 409 and 410, such that the tension of the tension device 409 was set to 100 Kg and the tension of the tension device 410 was set to 110 Kg, and the pressuring roller 405 was moved toward the right at a speed of 20 mm/sec, thereby transferring the ink on the surface rubber of the blanket 404 onto the work 415.

During this time, the elevating devices 407 and 408 were used to maintain the approach angle α between the blanket 404 and the work 415 at 20°, and the departing angle β at 25°.

These procedures transferred the ink of the pattern on the plate 403 onto the work 415 via the blanket 404, thus completing the offset printing according to the present embodiment.

The pattern printed on the soda-lime glass work 415 by the present embodiment was observed with a microscope, and there was absolutely no dropout or nicking of the pattern over the entire pattern area (400 mm by 300 mm) believed to be owing to defective reception or transfer of ink. Also, there were no pattern deformations which would indicate improper deformation of the blanket rubber, and the 20 μm pitch in the width direction was clearly separated and reproduced.

Further, using an automatic measuring machine (manufactured by SOKKIA Co., Ltd.), the dimensions in the length direction were measured at 5×4=20 places in increments of 100 mm square, to verify the printing dimensions precision. The results showed that the deviation was around ±5 to 7 μm at all places, meaning that the dimensions precision was even better than the ±10 μm of the cases with no blanket tension control.

Seventh Embodiment

The seventh embodiment will now be described with reference to the drawings.

FIG. 10 is a side view illustrating the overview of one example of an offset printing apparatus used with the present embodiment.

In this Figure, reference numeral 512 denotes a pressuring roller capable of moving in the printing direction by being guided by a guide 514 through a printing depressing amount setting unit 511, 513 denotes posts erected on the base of the printing apparatus so as to support both ends of the running guide 514 of the pressuring roller 512, and 524 denotes a printing surface table on which to place the printing work.

With this offset printing apparatus, a printing original plate 523a is placed upon the printing surface table 524 for transferring the ink on the plate to the blanket 521, following which a work 523b is placed thereupon for transferring of the ink on the blanket 521, and printing is performed. The blanket 521 is supported and suspended by both ends above the printing surface table 524, by the supporting unit including the elevating means 515 and 516 and the supporting rollers 55a and 56a above.

Also, this offset printing apparatus has positioned on both sides tension means 519 and 520 which contain pulse motors for driving the above supporting unit and providing tension to the blanket 521, and tension measuring means 517 and 518 for measuring the tension of the blanket 521 are provided to both of the tension means 519 and 520. Further, a position detecting unit is built into one tension means 519 for measuring the amount of movement of the blanket 521. Also, the offset printing apparatus is constructed such that the elevating means 515 and 516 and the supporting rollers 55a and 56a making up the supporting unit for supporting both ends of the blanket 521 are of a supporting structure movable in the printing direction, with the supporting unit being capable of moving and changing the approach angle α and the departing angle β, this correcting the amount of movement of the blanket 521 occurring during printing by driving the pulse motor for driving the blanket, serving as the driving means therefor. Also, computation processing means 526 are provided to the side of the main unit of the printing apparatus, as control means.

As for the computation processing means 526, a programmable controller with a response control speed of 5 μsec is used. The computation processing means 526 receives the position detecting data detected by the position detecting unit and the position detecting data sent to the recording means 523, and computes the correction values for correcting the amount of movement of the blanket, and is also capable of arbitrarily controlling the amount of movement of both ends of the suspended blanket 521 along with printing, in order to do away with the difference in the amount of blanket movement which occurs at the time of receiving ink and at the time of transferring ink.

Then, this offset printing apparatus performs printing by the pressuring roller 512 being guided from the left end to the right end of the plate 523*a* or work 523*b* by a guide 514 so as to perform sweeping.

Figure 11:
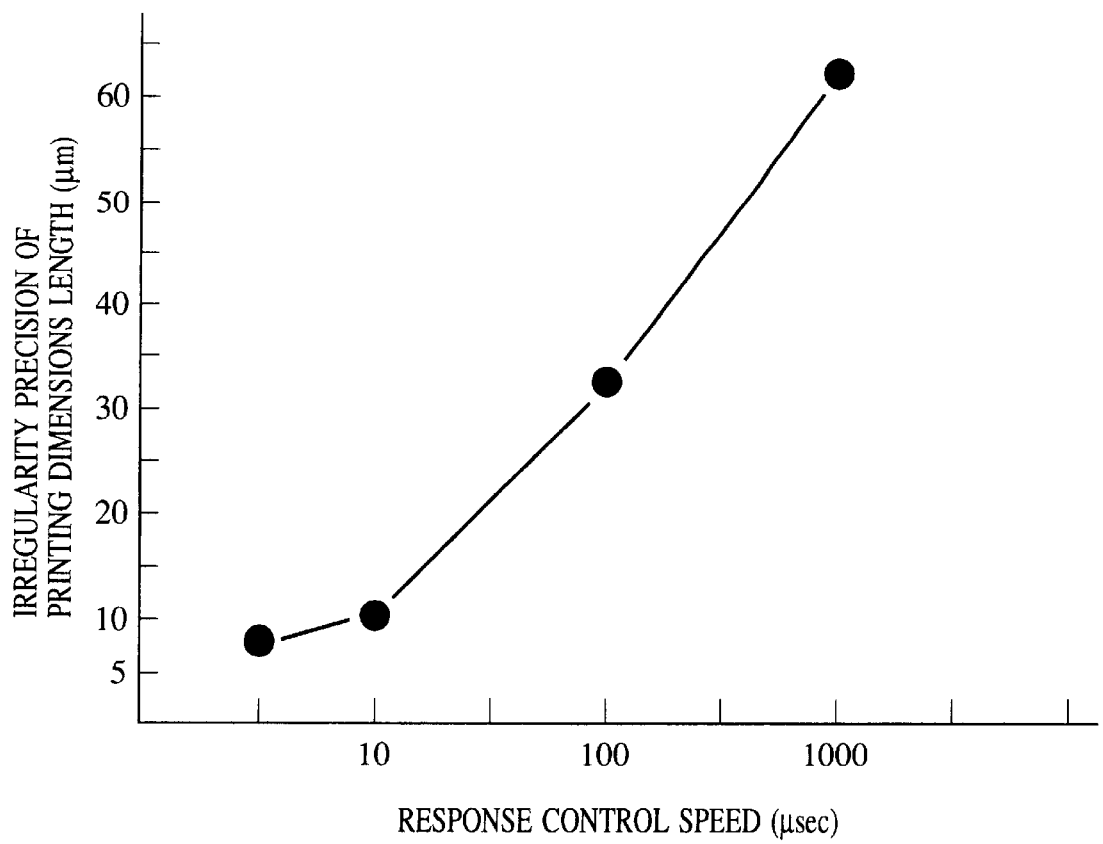
FIG. 11 is a graph illustrating the relationship between the response control speed of the programmable controller which serves as the computation processing means in the seventh embodiment, and the precision of irregularities in the printing dimensions length.

FIG. 11 is a graph illustrating the relation of irregularity precision ($\mu$m) as to the horizontal axis of computation response control speed ($\mu$sec) and the vertical axis of original plate dimensions length. This graph shows that a response control speed of 10 $\mu$sec or yields lower irregularities and allows printing at high precision.

The above has been an overview of the operation and structure of an offset printing apparatus according to the present embodiment; the following is regarding an experiment example of the printing method using the above offset printing apparatus. The offset printing apparatus shown in FIG. 10 was used, and actual printing was performed as follows:

The blanket 521 used was a silicone rubber surface blanket (web-formed, 700 mm wide and 1800 mm long). The thickness of the blanket 521 was 2.0 mm thick, with a stretching rate of 1.5% (under a load of 9806.65N (1000 Kg)/1 m width)).

The plate 523*a* used was a glass intaglio plate (outer form: 500 mm wide by 500 mm long, 3.0 mm thick, the pattern area thereupon was 400 mm wide by 400 mm long).

The work 523*b* used was a soda-lime glass plate (outer form: 500 mm wide by 500 mm long, 3.0 mm thick).

The ink used was gold resinated paste (solvents contained: terpineol BCA)

The pressuring roller 512 used was one formed of steel (35 mm in diameter and 800 mm in width).

Once the above members were prepared, first, ink was applied to the glass intaglio plate 523*a*, excess ink was removed with a doctor blade, this plate 523*a* was placed on the printing surface table 524, and the blanket surface was pressed against the plate 523*a* by bringing the blanket 521 onto the left end thereof and pressing the rear side of the blanket 521 with the pressuring roller 512. Next, the amount of blanket movement obtained by the calculation method based on dynamic analysis beforehand was input to the computation processing means 526, and the pressuring roller 512 was moved toward the right in FIG. 10 at a speed of 10 mm/sec.

At this time, the positional information of the blanket for every 0.1 second of the pressuring roller 512 was detected using a linear encoder ML-20 (manufactured by Canon Co., Ltd.), the amount of error with the predetermined setting value was obtained by the computation processing means 526, and ink was received on the surface rubber of the blanket 521 while performing correction adjusting with the blanket driving pulse motor. At this time, the blanket elevating means 515 and 516 were used to maintain the initial approach angle $\alpha$ of the blanket 521 as to the plate 523*a* at 25°, and the departing angle $\beta$ at 25°. As a result of this operation, the difference between the amount of movement of the blanket 521 and the preset amount of movement was an offset of +3 $\mu$m as to the entire 400 pattern mm area.

Next, the plate 523*a* on the printing surface table 524 was removed and replaced with the soda-lime glass work 523*b*, and in the same manner as above, the blanket surface was pressed against the work 523*b* by bringing the blanket 521 onto the left end thereof and pressing the rear side of the blanket 521 with the pressuring roller 512. Next, as with the case of ink reception, the amount of blanket movement obtained by the calculation method based on dynamic analysis beforehand was input to the computation processing means 526, and the pressuring roller 512 was moved toward the right at a speed of 10 mm/sec in FIG. 10. The amount of error between the positional information of the blanket 521 for every 0.1 second of the pressuring roller 512 at the above time of receiving ink, and the value detected by the linear encoder ML-20, was calculated by the computation processing means 526 and output as the correction amount, and the blanket tension tensioning means 519 was operated to operate the blanket 521 in real-time by an appropriate value, so as to correct the printing dimensions to obtain proper dimensions, while the ink on the surface rubber of the blanket 521 was transferred onto the work 523*b*.

These procedures transferred the ink of the pattern on the plate 523*a* onto the work 523*b* via the blanket 521, thus completing the offset printing according to the present embodiment. As a result of this operation, the difference between the amount of movement of the blanket 521 at the time of reception and at the time of ink transfer was an offset of +2 $\mu$m as to the entire 400 mm pattern area.

Incidentally, the printing pattern shown in FIG. 5 was used for the present embodiment. This pattern has rectangles of 160 $\mu$m by 80 $\mu$m, long in the printing direction, arrayed in 200 $\mu$m intervals in the printing direction and at a 160 $\mu$m pitch in the width direction. With the present embodiment, the pattern printed on the soda-lime glass work 523*b* was observed with a microscope, and there was absolutely no dropout or nicking of the pattern over the entire pattern area (400 by 400 mm) believed to be owing to defective reception or transfer of ink. Also, there were no pattern deformations which would indicate improper deformation of the blanket 521 rubber, and the 200 $\mu$m pitch in the width direction was clearly separated and reproduced. Further, using a measuring microscope, the length of the outer form of the printing area was measured, to verify the printing precision. The results showed that the deviation was within ±6 $\mu$m for the entire length, meaning good positional precision. Also, with the present embodiment, the above was repeated for 50 times and the printing precision was measured, which yielded shifting within ±10 $\mu$m for all works 523*b*.

Figure 12:
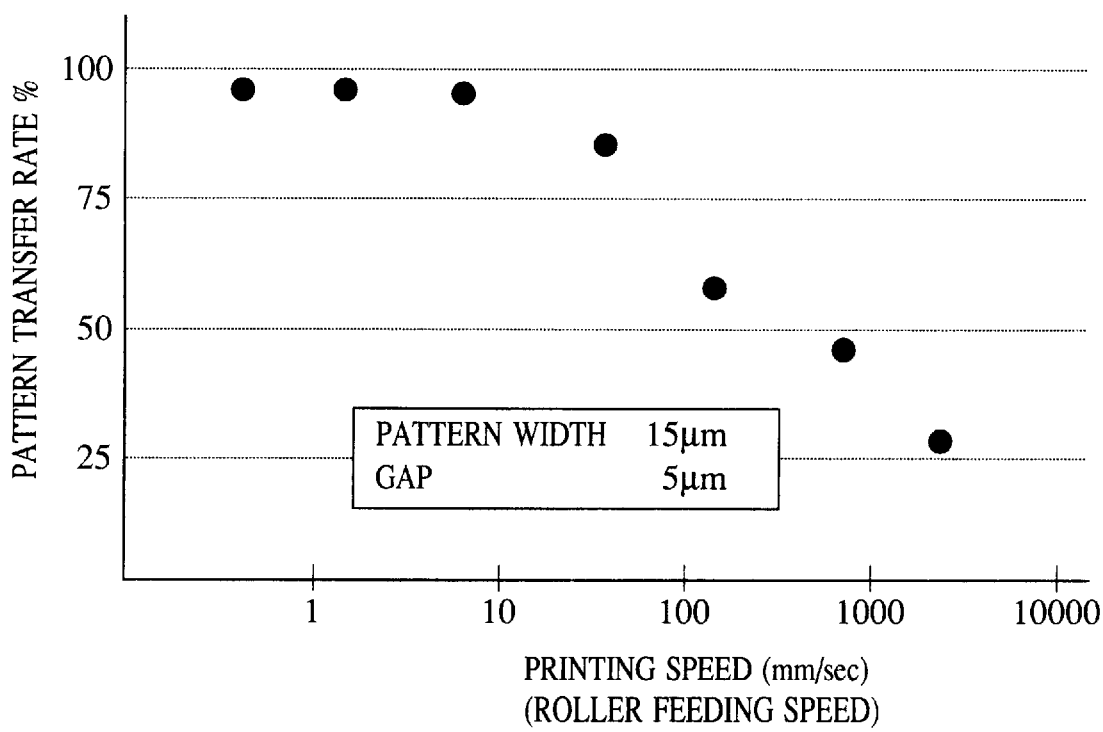
FIG. 12 is a graph illustrating the relationship between the printing speed and pattern transfer rate in the offset printing method according to the seventh embodiment.

FIG. 12 is a graph illustrating the relationship between the printing speed (mm/sec) which is the horizontal axis, and the pattern transfer rate (%) which is the vertical axis, in the case of performing printing with the offset printing method or apparatus according to the present embodiment. This graph shows that a high pattern transfer rate can be obtained at printing speeds of 10 mm/sec or slower.

Eighth embodiment

The offset printing apparatus according to the present embodiment is the same as that described above in the seventh embodiment with regard to the basic configuration, but greatly differs in the following point. The present embodiment performs printing without conducting blanket movement amount control at the time of the receiving printing wherein the ink layer is transferred from the glass intaglio plate 523*a* to the blanket 521, and performs printing conducting blanket movement amount control at the time of transferring only. The aim of the printing method or apparatus according to the present embodiment is to realize improvement in productivity by high-speed printing wherein the printing speed has been raised, and maintaining or improving the printing quality. That is, only measurement of the amount of movement of the blanket is performed at the time of receiving ink, and control is not performed, so high-speed printing can be performed at printing speeds of 100 to 1000 mm/sec. This is advantageous in that the volatilization of the ink solvent set in the glass intaglio original plate 523a is suppressed, so the ink can be speedily transferred from the glass intaglio original plate 523a to the blanket 521, meaning that the ink pattern for the entire printing area is formed uniformly on the blanket 521. This advantage is particularly effective at the time of forming minute patterns (patters of several µm) which dry easily.

With the present embodiment, a device for measuring the amount of movement of the blanket at the above receiving printing time is necessary.

Making control at the time of transfer printing based on the measurement results of the blanket movement amount at the receiving printing time, by the blanket tension tensioning means 519 providing the same blanket moving amount as that of the reception printing time, as with the seventh embodiment, has enabled printing that is high-speed printing and also is high quality printing. Also, reproduction according to the offset printing method with the present embodiment was repeated for 50 times, which yielded good printing position precision of ±10 µm.

Figure 13:
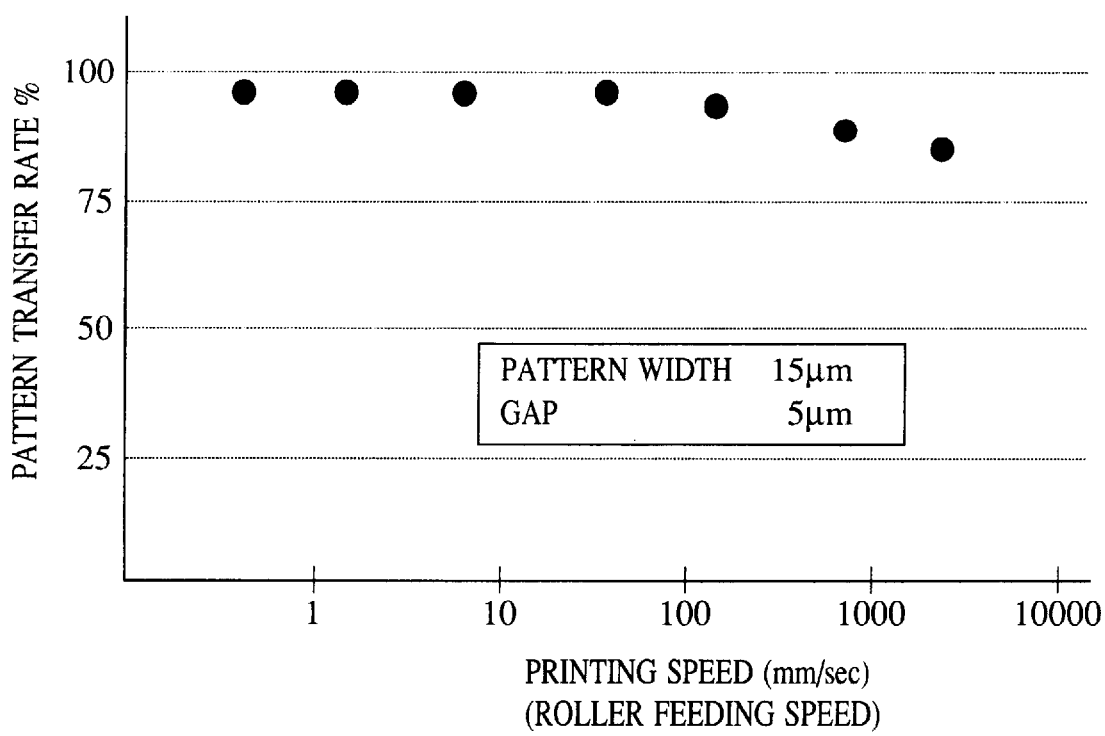
FIG. 13 is a graph illustrating the relationship between the printing speed and pattern transfer rate in the offset printing method according to an eighth embodiment.

FIG. 13 is a graph illustrating the relation between the printing speed (horizontal axis: in units of mm/sec) and pattern transfer rate (vertical axis; in units of %), in the event that printing is performed with the offset printing method or apparatus according to the present embodiment. This graph shows that high pattern transfer rate can be obtained even at speeds exceeding 100 mm/sec. With the present embodiment, printing can be performed at speeds far faster than the above-described seventh embodiment, with high pattern transfer rates.

SECOND COMPARATIVE EXAMPLE

Description has been made regarding the above seventh and eighth embodiments, that high-quality printing can be obtained by detecting the blanket position and controlling the amount of movement of the blanket. The comparative example which will be now described is an example of printing precision results wherein blanket position control according to blanket position detection is not performed, but rather the tension of the blanket is measured with a tension gauge, and control is executed according to the printing method so that the tension values are constant.

Using the same glass intaglio plate, soda-lime glass, printing ink, and other basic configurations the same as that of the seventh embodiment, a printing method was performed wherein the blanket tension is measured with a tension gauge and the tension is controlled so that the tension values are constant, yielding a blanket movement amount of ±10.010 mm at the time of reception printing, and a blanket movement amount of −9.950 mm at the time of transfer printing. As a result, the positional precision for the printing pattern was great at +58 µm. Also, this was repeated 50 times to confirm reproducibility, which yielded positional precision irregularities for the printing pattern of ±150 µm over the entire printing area, showing that the above seventh embodiment yielded much better results.

According to the above-described seventh and eighth embodiments, a high-precision offset printing method and offset printing device can be provided, wherein the amount of movement of the blanket is arbitrarily controlled at each of the times of reception of ink and transferring of ink, thereby doing away with the difference in the amount of blanket movement at the time of receiving ink and transferring ink, since there are no effects of difference in the amount of movement due to rolling friction existing between the blanket and original plate or blanket and work, nor are there effects of the amount of action error which the machine has.

Also, according to the seventh and eighth embodiments, suitable pattern form and highly-precise printing dimension precision can be maintained, without loosing reception and transferring properties over the entire face even in the event that offset printing of a wide pattern area is performed for a large size.

Further, similarly good printing can be performed even in the event that the work and pattern area grows even larger than that shown in the above embodiments.

Ninth Embodiment

Figure 14:
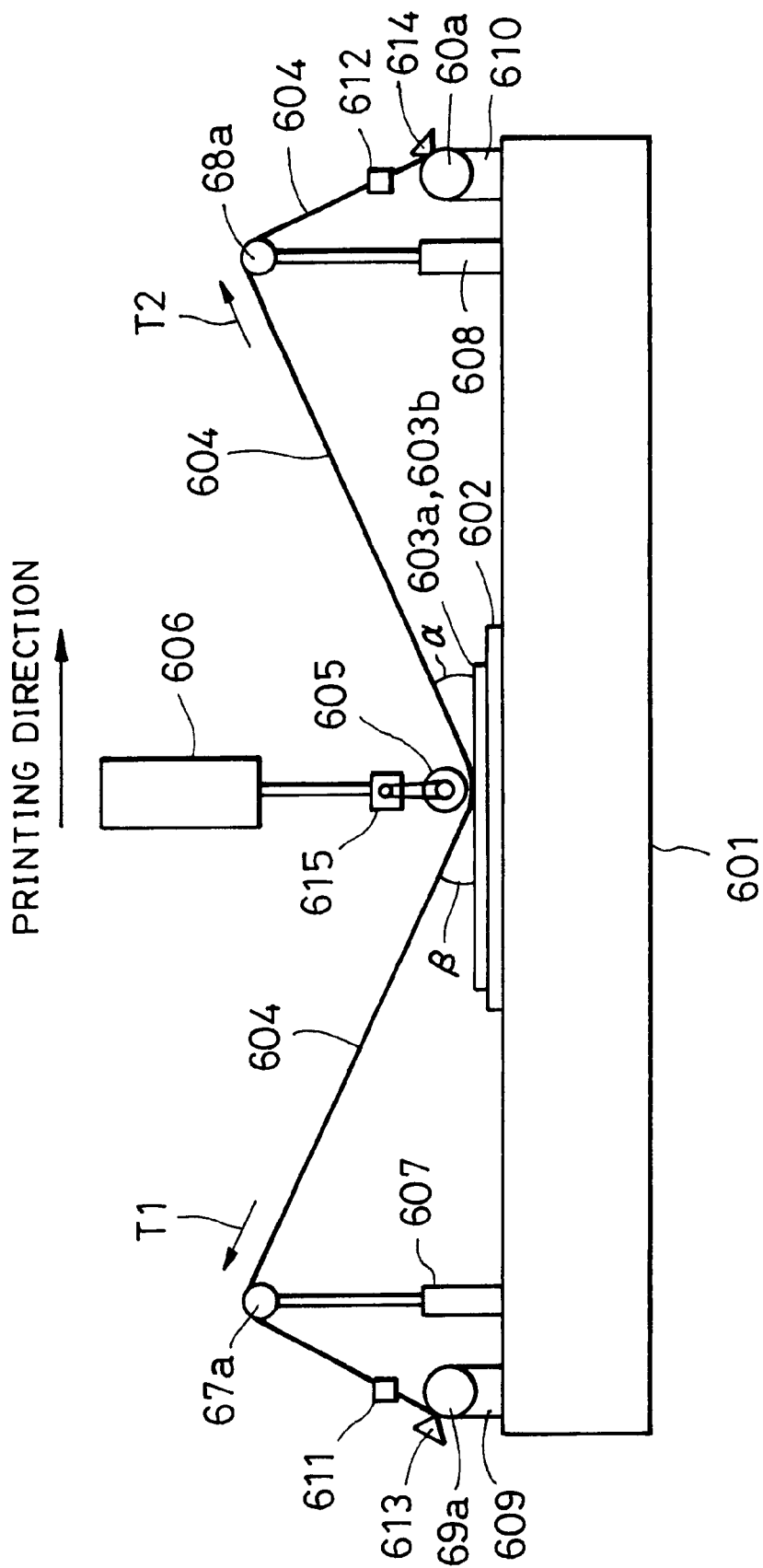
FIG. 14 is a schematic side view showing the offset printing apparatus used with a ninth embodiment.

The present embodiment will be described with reference to FIG. 14. FIG. 14 is a side view illustrating the overview of an offset printing apparatus according to the present embodiment. With this offset printing apparatus, a printing original plate 603a is placed on a printing surface table 602 provided on a common base surface table 601 at the time of receiving ink, and a work 603b is placed thereon at the time of ink transfer, thereby performing printing. Also, the blanket 604 is suspended above the printing surface table 602, by tension rollers 69a and 60a of tension means 609 and 610 at both ends in the printing direction, and elevatable supporting rollers 67a and 68a at the upper tip of the elevating means 607 and 608. The blanket 604 is set facing downwards.

At the time of printing, a pressuring roller 605 attached to the tip of the pressuring jig 606 descends while pressing the rear plane of the blanket 604, and the surface of the blanket 604 is pressed against the plate 603a or the work 603b with a set depressing amount D, and a constant amount of tension is applied to the blanket 604 by the tension means 609 and 610 at both ends. Subsequently, printing is performed by the pressuring roller 605 of the pressuring jig 606 moving in the printing direction from the left end to the right end of the plate 603a or the work 603b as shown in FIG. 14. At this time, the approach angle α and the departing angle β formed between the blanket 604 and the plate 603a or the work 603b are maintained at a set arbitrary angle during the printing operation, by means of elevating means 607 and 608, each automatically adjusting the height of the supporting rollers 67a and 68a.

Further, the blanket tensions T1 and T2 are detected in real-time by the pressure detecting sensors 611 and 612 positioned at the blanket-supporting ends, and this information is fed back to the pulse motors and the like in the driving unit placed in the supporting unit, thus enabling intentional setting of the blanket tension for the blanket 604 at the right and left sides of the pressuring roller 605 of the pressuring jig 606 during printing, and further, the roller driving unit 615 of the pressure roller 605 can be controlled with the information from the position sensors 613 and 614.

Now, description has so far been made regarding the overall configuration of an offset printing apparatus according to the present embodiment; a printing method according to the present embodiment using this printing apparatus will now be described.

The printing apparatus shown in FIG. 14 was used to perform actual printing as follows.

Blanket 604: Blanket with silicone rubber surface (silicone rubber 0.5 mm thick applied to rear face) (web-form, 600 mm wide and 2000 mm long, 2.0 mm thick) (stretching rate: 1.5% under load of 9806.65 N(1000 Kg)/lm width)

Plate 603a: Glass intaglio plate (outer form: 500 mm wide by 400 mm long, 3.0 mm thick) (pattern area: 400 mm wide by 300 mm long)

Work 603b: Soda-lime glass (outer form: 500 mm wide by 400 mm long, 3.0 mm thick)

Ink: Gold resinated paste (solvents contained: terpineol, BCA)

Pressing roller 605: Formed of steel (30 mm in diameter and 650 mm in width) (sandblasted to a coarseness Ra of 100 μm)

Figure 15:
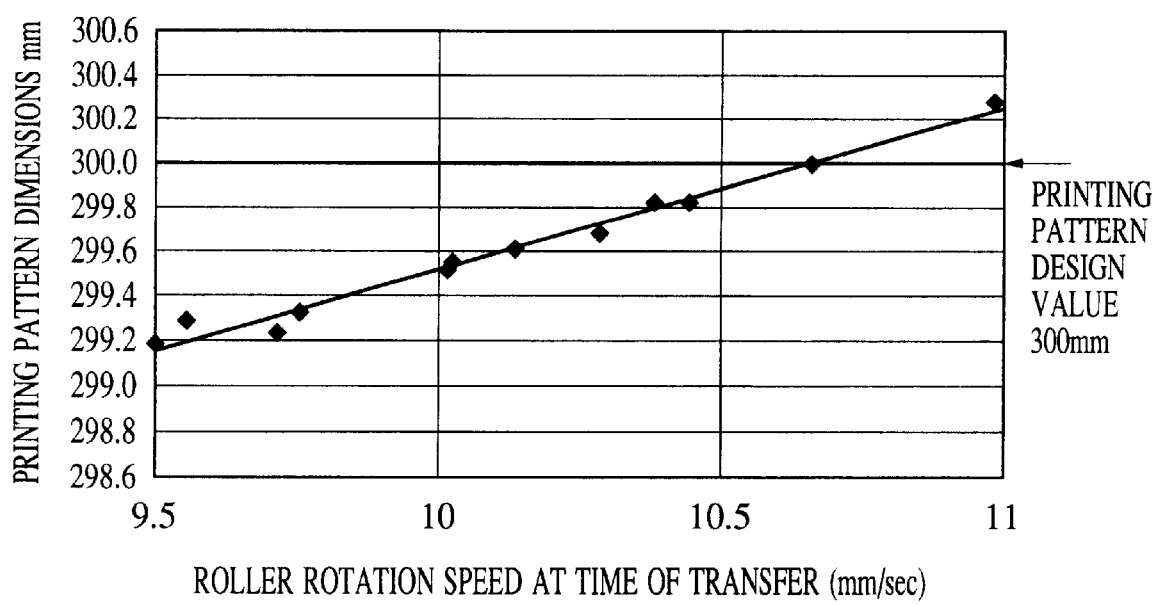
FIG. 15 is a graph illustrating the correction calibration line at the time of ink reception, for the offset printing apparatus according to a tenth embodiment.
Figure 16:
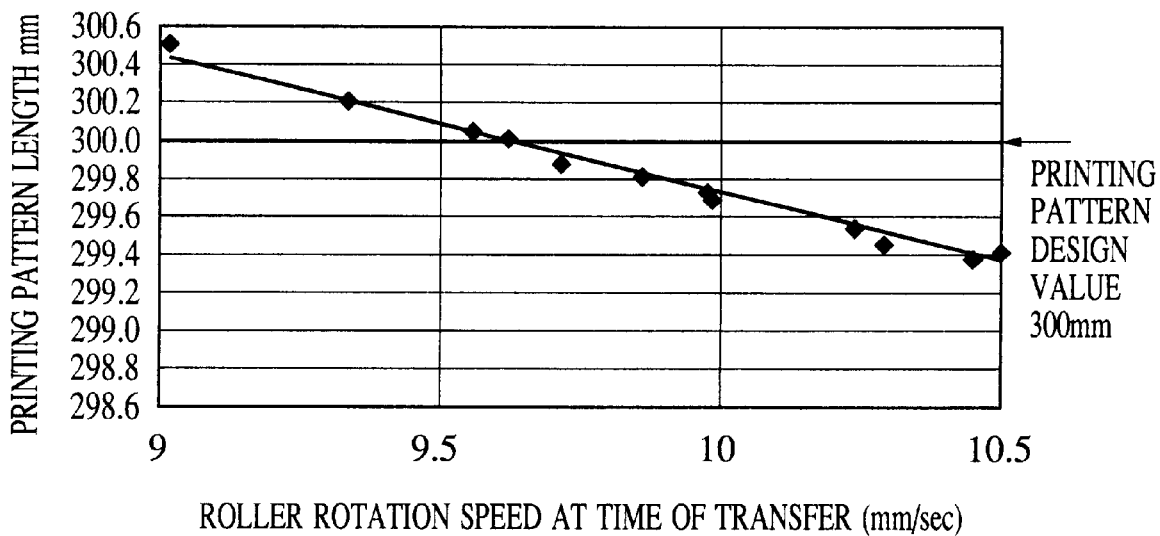
FIG. 16 is a graph illustrating the correction detection line at the time of ink transfer, for the offset printing apparatus according to the tenth embodiment.

Once the above materials are prepared, first, in order to understand the relation between blanket tension and the pattern dimensions change on the blanket 604 at the time of receiving ink, and the relation with the pattern dimensions change from the blanket 604 to the work 603*b* at the time of ink transfer, the blanket movement amounts at the ink reception time and transfer time are calculated such that each become equal to the printing length dimensions, printing is actually performed, and the rotation speed of the pressuring roller 605 is set such that the printing pattern dimensions match the designed dimensions. As for the results of the experiment with the configuration of the above materials and members, printing conditions were obtained wherein the desired printing pattern dimensions could be obtained, by synchronizing the rotation of the pressuring roller 605 with the feeding speed of the pressuring jig 606 at the time of receiving ink so as to perform the printing reception action; and setting the circumference speed of the pressuring roller 605 to 9.6 mm/sec and the feeding speed of the pressuring jig 606 to 10 mm/sec at the time of ink transferring (see the graphs in FIGS. 15 and 16 which illustrate the relation between the roller rotation speed and the printing pattern length). The graphs shown in FIGS. 15 and 16 are correction calibration curves respectively for the ink reception time and ink transferring time, under the conditions of a printing pattern design value of 300 mm, printing pressure of 2353.6 N (240 kg), blanket tension of 294.195 N (30 kg), and pressuring jig feeding speed of 10 mm/sec.

Figure 19:
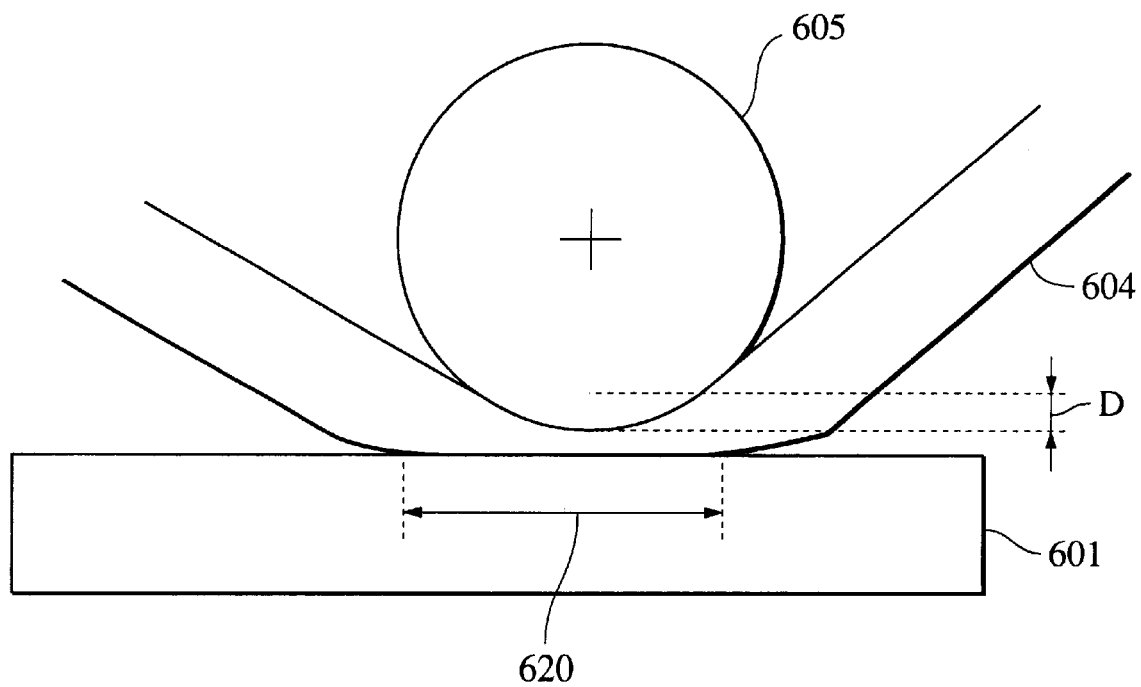
FIG. 19 is an enlarged diagram of the point of contact between the blanket and work, from FIG. 14.
Figure 20:
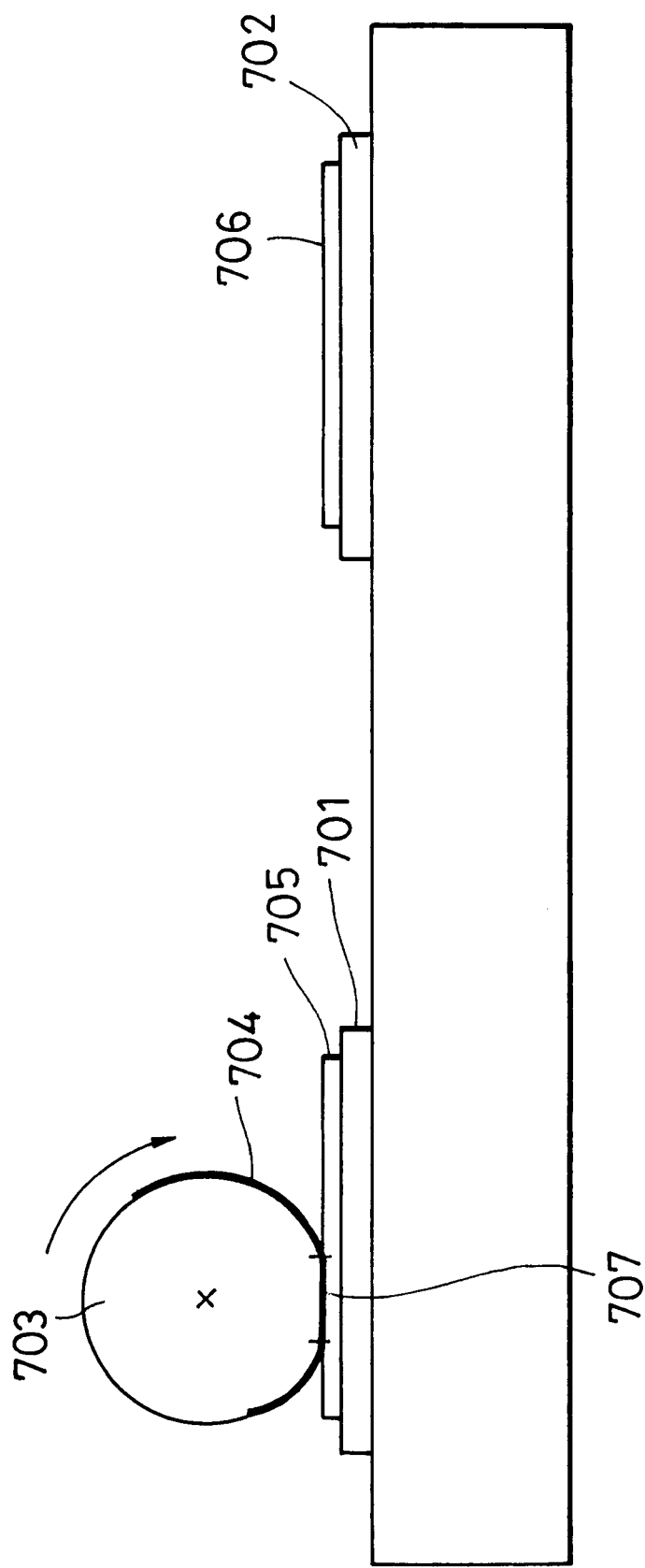
FIG. 20 is a conventionally-known flatbed proof press type offset printing apparatus.

Next, ink was applied to the glass intaglio plate, excess ink was removed with a doctor blade, this plate 603*a* was placed on the printing surface table 602, and the blanket surface was pressed against the plate 603*a* by bringing the blanket 604 onto the left end of the plate 603*a* and pressing the rear side of the blanket 604 with the pressuring roller 605. The depressing amount D for the blanket 604 here was set at 0.1 mm, as shown in FIG. 19, so that the nip width 620 is set at an appropriate value. Next, the tensions placed on each portion of the blanket 604 to the left and right of the pressing point were set to 100 Kg each, by the tension means 609 and 610. Also, the elevating means 607 and 608 were used during printing to maintain the approach angle α between the blanket 604 and the plate 603*a* at 25°, and the departing angle β at 25°. Then, the pressuring roller 605 was moved toward the right at a speed of 10 mm/sec which is the feeding speed of the pressuring jig 606, thereby receiving the ink on the surface rubber of the blanket 604. At this time, in order to maintain the printing form, the rotation of the pressuring roller 605 was set so as to be equal to the feeding speed of the pressuring jig 606. However, in this case, the printing dimensions received are approximately 10 mm shorter than the original plate. Accordingly, ink was received on the blanket 604 without damaging the pattern form on the plate 603*a*.

Next, the plate 603*a* on the printing surface table 602 was removed and replaced with the work 603*b*, and in the same manner as above, the blanket surface was pressed against the work 603*b* by bringing the blanket 604 onto the left end thereof and pressing the rear side of the blanket 604 with the pressuring roller 605. The depressing amount D for the blanket 104 here was set at 0.1 mm, as shown in FIG. 19. Next, the tensions placed on the blanket 604 to the left and right were set to 294.195 N (30 Kg) each, by the tension means 609 and 610, the elevating means 607 and 608 were used to make settings so as to maintain the approach angle α between the blanket 604 and the work 603*b* at 25°, and the departing angle β at 250. Then, the pressuring roller 605 was moved toward the right at a speed of 10 mm/sec which is the feeding speed of the pressuring jig 606, thereby transferring the ink on the surface rubber of the blanket 604 onto the work 603*b*. At this time, in order to perform correction to the printing dimensions, the rotation of the pressuring roller 605 was set to a speed slightly slower than the feeding speed of the pressuring jig 606 (10 mm/sec) by the roller driving unit 615 (circumference speed of 9.6 mm/sec in the present embodiment), based on the amount of blanket movement at the time of transfer calculated beforehand. Thus printing was carried out.

These procedures transferred the ink of the pattern on the plate 603*a* into the work 603*b* via the blanket 604, thus completing the offset printing according to the present embodiment.

Incidentally, the printing pattern shown in FIG. 3 was used for the above-described present embodiment as well. This printing pattern has true squares which are 200 μm square and arrayed in 200 μm intervals in the printing direction and in alternating 20 μm and 180 μm intervals in the width direction.

The pattern printed on the soda-lime glass work 603*b* by the above-described present embodiment was observed with a microscope, and there was no dropout or nicking of the pattern over the entire pattern area (400 mm by 300 mm) believed to be owing to defective reception or transfer of ink. Also, there were no pattern deformations which would indicate improper deformation of the rubber of the blanket 604, and the 20 μm pitch in the width direction was clearly separated and reproduced. Further, the results of the present embodiment were measured using an automatic measuring machine (manufactured by SOKKIA Co., Ltd.), which showed that deviation was approximately ±5 μm at all places, meaning that the dimensional precision was better than the ±30 μm in deviation obtained in the event that rotation control of the pressuring roller 605 is not performed.

Tenth Embodiment

The printing apparatus shown in FIG. 14 was used to perform actual printing as follows with the present embodiment, as well.

Blanket 604: Blanket with silicone rubber surface (silicone rubber 0.5 mm thick applied to rear face) (web-form, 600 mm wide and 2000 mm long, 2.0 mm thick) (stretching rate: 1.5% under load of 9806.65 N(1000 Kg)/lm width)

Plate 603*a*: Glass intaglio plate (outer form: 500 mm wide by 400 mm long, 3.0 mm thick) (pattern area: 400 mm wide by 300 mm long)

Work 603*b*: Soda-lime glass (outer form: 500 mm wide by 400 mm long, 3.0 mm thick)

Ink: Gold resinated paste (solvents contained: terpineol, BCA)

Pressing roller 605: Formed of steel (30 mm in diameter and 650 mm in width) (sandblasted to a coarseness Ra of 100 μm)

Once the above materials are prepared, first, in order to understand the relation between blanket tension and the pattern dimensions change on the blanket 604 at the time of receiving ink, and the relation with the pattern dimensions change from the blanket 604 to the work 603*b* at the time of ink transfer, the blanket movement amounts at the ink reception time and transfer time are calculated such that each become equal to the printing length dimensions, printing is actually performed, and the rotation speed of the pressuring roller 605 is set such that the printing pattern dimensions match the designed dimensions. As for the results of the experiment with the configuration of the above materials and members, printing conditions were obtained wherein the desired printing pattern dimensions could be obtained, the surface circumference speed of the pressuring roller 605 was set to 10.2 mm/sec and the feeding speed of the pressuring jig 606 to 10 mm/sec at the time of ink reception, whereby the printing ink reception operation was performed, and the surface circumference speed of the pressuring roller 605 was synchronized with the feeding speed of the pressuring jig 606 to 10 mm/sec at the time of ink transfer, whereby ink transfer was performed (see the graphs in FIGS. 15 and 16).

Next, ink was applied to the glass intaglio plate 603a, excess ink was removed with a doctor blade, this plate 603a was placed on the printing surface table 602, and the blanket surface was pressed against the plate 603a by bringing the blanket 604 onto the left end thereof and pressing the rear side of the blanket 604 with the pressuring roller 605. The depressing amount D for the blanket 604 here was set at 0.1 mm. Also, the elevating means 607 and 608 were used during printing to maintain the approach angle α between the blanket 604 and the plate 603a at 25°, and the departing angle β at 25°, and the tension placed on the blanket 604 at the left and right of the pressing point was set to 100 Kg, by the tension means 609 and 610. At this time, the rotation of the pressuring roller 605 was set at 10.20 mm/sec in circumference speed, thereby allowing the ink pattern on the blanket 604 at the time of receiving ink to be the same dimensions as the printing original plate length.

Next, the plate 603a on the printing surface table 602 was removed and replaced with the work 603b, and in the same manner as above, the blanket surface was pressed against the work 603b by bringing the blanket 604 onto the left end thereof and pressing the rear side of the blanket 604 with the pressuring roller 605. The depressing amount D for the blanket 604 here was set at 0.1 mm. Also, relating to the printing angle, the elevating means 607 and 608 were used to maintain the approach angle α between the blanket 604 and the work 603b at 25°, and the departing angle β at 25°. Next, the tension applied to the blanket 604 was set to 980.665 N (100 Kg), by the tension means 609 and 610. The pressuring roller 605 was set to the feeding speed of 10 mm/sec of the pressuring jig 606, thereby transferring the ink on the surface rubber of the blanket 604 onto the work 603b. At this time, the rotation of the pressuring roller 605 was set to a circumference speed of 9.6 mm/sec by the driving unit 615.

These procedures transferred the ink of the pattern on the plate 603a onto the work 603b via the blanket 604, thus completing the offset printing according to the present embodiment.

The pattern printed on the soda-lime glass work 603b by the above-described present embodiment was observed with a microscope, and there was absolutely no dropout or nicking of the pattern over the entire pattern area (400 mm by 300 mm) believed to be owing to defective reception or transfer of ink. Also, there were no pattern deformations which would indicate improper deformation of the rubber of the blanket 604, and the 20 μm pitch in the width direction was clearly separated and reproduced. Further, using an automatic measuring machine (manufactured by SOKKIA Co., Ltd.), the dimensions in the length direction were measured at 5×4=20 places in increments of 100 mm square, to verify the printing dimensions precision. The results showed that the deviation was approximately ±5 to 7 μm at all places.

Also, though the above-described ninth embodiment performed dimensions adjustment at the time of reception, and the above-described tenth embodiment performed dimensions adjustment at the time of transfer, the same effects can be obtained even by controlling the blanket movement amount only at one of the receiving time or transferring time, and selection can be made regarding which will be used for dimensions adjustment, by the other properties such as parameters, ink viscosity, plate properties, and so forth.

THIRD COMPARATIVE EXAMPLE

With this third comparative example, blanket movement amount control by driving the roller was not performed, rather, an experiment was conducted wherein the setting was made such that the pressuring roller 605 rotates as led following the feeding speed of the pressuring jig 606.

The printing apparatus shown in FIG. 14 was also used to perform actual printing as follows with this third comparative example, as well.

Blanket 604: Blanket with silicone rubber surface (silicone rubber 0.5 mm thick applied to rear face) (web-form, 600 mm wide and 2000 mm long, 2.0 mm thick) (stretching rate: 1.5% under load of 9806.65 N(1000 Kg)/lm width)

Plate 603a: Glass intaglio plate (outer form: 500 mm wide by 400 mm long, 3.0 mm thick) (pattern area: 400 mm wide by 300 mm long)

Work 603b: Soda-lime glass (outer form: 500 mm wide by 400 mm long, 3.0 mm thick)

Ink: Gold resinated paste (solvents contained: terpineol, BCA)

Pressing roller 605: Formed of steel (30 mm in diameter and 650 mm in width) (sandblasted to a coarseness Ra of 100 μm)

The feeding speed of the pressuring jig 606 was set to 10 mm/sec, and printing reception and transfer operations are performed. First, ink was applied to the glass intaglio plate 603a, excess ink was removed with a doctor blade, this plate 603a was placed on the printing surface table 602, and the blanket surface was pressed against the plate 603a by bringing the blanket 604 onto the left end thereof and pressing the rear side of the blanket 604 with the pressuring roller 605. The depressing amount D for the blanket 604 here was set at 0.1 mm. Also, the elevating means 607 and 608 were used to maintain the approach angle α between the blanket 604 and the plate 603a at 25°, and the departing angle β at 25°, and the tensions placed on each portion of the blanket 604 to the left and right of the pressing point were set to 100 Kg each, by the tension means 609 and 610.

Also, the elevating means 607 and 608 were used during printing to maintain the approach angle α between the blanket 604 and the plate 603a at 25°, and the departing angle β at 25°. Then, the pressuring roller 605 was moved toward the right direction in FIG. 14 at a speed of 10 mm/sec, and ink was received on the surface rubber of the blanket 604.

Next, the plate 603a on the printing surface table 602 was removed and replaced with the work 603b, and in the same manner as above, the blanket surface was pressed against the work 603b by bringing the blanket 604 onto the left end thereof and pressing the rear side of the blanket 604 with the pressuring roller 605. The depressing amount D for the blanket 604 here was set at 0.1 mm. Next, the tensions applied to the blanket 604 right and left were set to 294.195 N (30 Kg) by the tension means 609 and 610, the elevating means 607 and 608 were used to set the approach angle α between the blanket 604 and the work 603b so as to be maintained at 25°, and the departing angle β at 25°, the pressuring roller 605 was moved toward the right direction at the feeding speed of 10 mm/sec of the pressuring jig 606, and ink on the surface rubber of the blanket 604 was transferred onto the work 603b.

These procedures transferred the ink of the pattern on the plate 603a onto the work 603b via the blanket 604, thus completing the offset printing according to the present comparative example. Incidentally, the printing pattern shown in FIG. 3 was used for the present comparative example as well. This printing pattern has true squares which are 200 $\mu$m square and arrayed in 200 $\mu$m intervals in the printing direction and in alternating 20 $\mu$m and 180 $\mu$m intervals in the width direction. The pattern printed on the soda-lime glass work 603b of the present comparative example was observed with a microscope, and there was no dropout or nicking of the pattern over the entire pattern area (400 mm by 300 mm) believed to be due to defective reception or transfer of ink. However, using an automatic measuring machine (manufactured by SOKKIA Co., Ltd.) to measure the dimensions in the length direction at 5×4=20 places in increments of 10 mm square in order to verify the printing position precision, revealed that the printing dimensions had been printed approximately 550 $\mu$m shorter than the pattern area length 300 mm, in the printing direction.

Eleventh Embodiment

The printing apparatus shown in FIG. 14 was used to perform actual printing as follows with the present embodiment, as well.

Blanket 604: Blanket with silicone rubber surface (silicone rubber 0.5 mm thick applied to rear face) (web-form, 600 mm wide and 2000 mm long, 2.0 mm thick) (stretching rate: 1.5% under load of 9806.65 N(1000 Kg)/lm width)

Plate 603a: Glass intaglio plate (outer form: 500 mm wide by 400 mm long, 3.0 mm thick) (pattern area: 400 mm wide by 300 mm long)

Work 603b: Soda-lime glass (outer form: 500 mm wide by 400 mm long, 3.0 mm thick)

Ink: Gold resinated paste (solvents contained: terpineol, BCA)

Pressing roller 605: Formed of steel (30 mm in diameter and 650 mm in width) (sandblasted to a coarseness Ra of 100 $\mu$m)

With the present embodiment, no calibration line or the like in particular regarding the relation between the amount of movement of the blanket and the printing dimensions was obtained beforehand, rather, the amount of movement of the blanket was detected by position sensors 613 and 614 at the time of printing reception, and a program was compiled to perform rotation control of the pressuring roller 605 so as to recreate that blanket movement amount at the time of printing transfer, and printing was performed accordingly.

The printing conditions were: printing pressure of 2353.60 N (240 Kg), feeding speed of the pressuring jig 606 at 10 mm/sec, blanket tension of 294.1995 N (30 kg), and approach angle $\alpha$ and departing angle $\beta$ of 25° at the time of printing.

Regarding the pressuring roller 605 at the time of printing reception, no control was performed in particular, but rather synchronized with the feeding speed of the pressuring jig 606. Information regarding the amount of blanket movement at the time of printing reception was read by the computer in real time from the position sensors 613 and 614 attached to the blanket supporting unit, in 0.1 second intervals, and this was stored in memory. Next, control of the motor driving for the pressuring roller 605 was performed, so that the amount of blanket movement matches the above position information value at the next printing transfer operation. The printing pattern thus printed exhibited results almost the same as those of the ninth embodiment and tenth embodiment. The pattern printed on the soda-lime glass work 603b of the present embodiment was observed with a microscope, and there was no dropout or nicking of the pattern over the entire pattern area (400 mm by 300 mm) believed to be owing to defective reception or transfer of ink. Also, there were no pattern deformations which would indicate improper deformation of the rubber of the blanket 604, and the 20 $\mu$m pitch in the width direction was clearly separated and reproduced. Further, using an automatic measuring machine (manufactured by SOKKIA Co., Ltd.), the dimensions in the length direction were measured at 5×4=20 places in increments of 100 mm square, to verify the printing dimensions precision, and the results showed that the deviation was approximately ±5 to 7 $\mu$m at all places.

As described in the above ninth through eleventh embodiments, controlling the pressuring jig for doing away with the difference in blanket movement amount occurring at the ink receiving time and ink transferring time exhibits the advantages of enabling printing with high dimensional precision to be obtained. Also, according to the above ninth through eleventh embodiments, setting the rotational speed of the pressuring roller by the driving system enables control of the amount of movement of the blanket at the time of receiving and the time of transferring ink, so the elongation and shrinking of pattern dimensions can be controlled during printing, and at the time of receiving and the time of transferring ink, as compared with conventional cases wherein the only rotations which can be provided are equal to the feeding speed of the pressuring jig, thus allowing printing with even higher precision to be obtained.

Twelfth Embodiment

The above-described offset printing apparatus shown in FIG. 1 was used to perform printing with the present embodiment. The offset printing method according to the present embodiment will now be described.

The specifications for the members used in the present embodiment are as follows:

1. The three-layer structured silicone rubber blanket shown in FIG. 17 was used as the blanket 104. The surface layer 70 was formed of 0.3 mm of RTV type silicone rubber, the intermediate layer 71 was formed of 0.5 mm of a hard sponge material, and the supporting layer 72 was formed of 0.2 mm of uniaxial oriented PET film. The size of this three-layer structured blanket was: 600 mm wide, 2000 mm long, and in a sheet form 1.0 mm thick. Also, the mechanical properties of this three-layer structured blanket were: Young's modulus in the printing direction of the supporting layer 72 of 550 kgf/mm$^2$, with a compression stress of 0.1 kgf/mm$^2$ when compressed by 0.1 mm.

2. As for the plate 105, a glass intaglio plate (outer form: 500 mm wide by 400 mm long, 3.0 mm thick, pattern area: 400 mm wide by 300 mm long) was used.

3. As for the work 106, a soda-lime glass (outer form: 500 mm wide by 400 mm long, 3.0 mm thick) was used.

4. As for the ink, gold resinated paste (solvents contained: terpineol, BCA) was used.

5. As for the pressuring roller 103, a roller formed of steel (30 mm in diameter and 650 mm in width) was used.

Having prepared the above members, first, ink was applied to the glass intaglio plate, excess ink was removed with a doctor blade, this plate 105 was placed on the printing surface table 102, and the blanket surface was pressed against the plate 105 by bringing the blanket 104 onto the left end thereof and pressing the rear side of the blanket 104 with the pressuring roller 103. The depressing amount D for the blanket here was set at 0.1 mm. Next, tension of 120 kg was applied to each portion of the blanket to the left and right of the pressing point, by the tension devices 113 and 114. Then, the pressuring roller 103 was moved toward the right at a speed of 20 mm/sec, thereby receiving the ink on the surface rubber of the blanket 104. Next, the plate 105 on the printing surface table 102 was removed and replaced with the work 106, and in the same manner as above, the blanket surface was pressed against the work 106 by bringing the blanket 104 onto the left end thereof and pressing the rear side of the blanket 104 with the pressuring roller 103. The depressing amount D for the blanket here was set at 0.12 mm. Next, tension of 120 kg was applied to each portion of the blanket to the left and right of the pressing point, by the tension devices 113 and 114. Then, the pressuring roller 103 was moved toward the right at a speed of 20 mm/sec, thereby transferring the ink on the surface rubber of the blanket 104 onto the work 106. These procedures transferred the ink of the pattern on the plate 105 onto the work 106 via the blanket 104, thus completing the offset printing according to the present embodiment.

Incidentally, the printing pattern shown in FIG. 3 was used for the present embodiment as well. This pattern has true squares which are 200 $\mu$m square and arrayed in 200 $\mu$m intervals in the printing direction and in alternating 20 $\mu$m and 180 $\mu$m intervals in the width direction.

The pattern printed on the soda-lime glass work by the above-described present embodiment was observed with a microscope, and there was absolutely no dropout or nicking of the pattern over the entire pattern area (400 mm by 300 mm) believed to be owing to defective reception or transfer of ink. Also, there were no pattern deformations which would indicate improper deformation of the rubber of the blanket 104, and the 20 $\mu$m pitch in the width direction was clearly separated and reproduced. Further, the results were measured at 5×4=20 places in increments of 100 mm square, using an automatic measuring machine (manufactured by SOKKIA Co., Ltd.), to verify the printing dimensions precision, which showed that deviation was within ±10 $\mu$m at all places, meaning good positional precision.

FOURTH COMPARATIVE EXAMPLE

The present comparative example has been made in order to verify the excellence of the blanket used in the above Twelfth embodiment, by performing printing with the same printing apparatus and under the same printing conditions as in the Twelfth embodiment, only changing the type of blanket.

Figure 17:
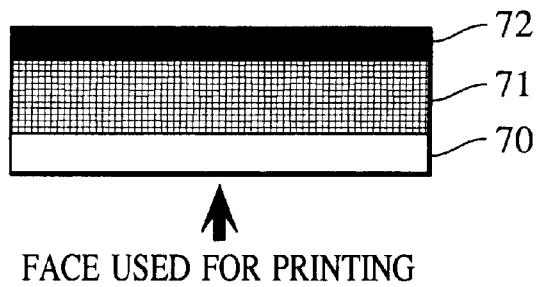
FIG. 17 is a schematic cross-sectional view of the structure of the blanket used with a twelfth embodiment.

First, as a first comparative blanket, the three-layered structure silicone rubber blanket shown in FIG. 17 was used. The surface layer 70 was formed of 0.3 mm of RTV type silicone rubber, the intermediate layer 71 was formed of 0.5 mm of a hard sponge material, and the supporting layer 72 was formed of 1.2 mm of cotton woven cloth. The size of this three-layer structured blanket was: 600 mm wide, 2000 mm long, and in a sheet form 2.0 mm thick. Also, the mechanical properties of this three-layer structured blanket were: Young's modulus in the printing direction of the supporting layer 72 of 60 kgf/mm$^2$, with a compression stress of 0.08 kgf/mm$^2$ when compressed by 0.1 mm.

Next, as a second comparative blanket, a two-layer structured silicone rubber blanket was used. The surface layer was formed of 0.3 mm of RTV type silicone rubber, and the supporting layer was formed of 0.2 mm of uniaxial oriented PET film. The size of this two-layer structured blanket was: 600 mm wide, 2000 mm long, and in a sheet form 0.5 mm thick. Also, the mechanical properties of this two-layer structured blanket were: Young's modulus in the printing direction of the supporting layer of 550 kgf/mm$^2$, with a compression stress of 1.2 kgf/mm$^2$ when compressed by 0.1 mm.

In the present comparative example, with the first comparative blanket, the printing position precision of the length dimensions in the printing direction were elongated by approximately 50 $\mu$m. Also, with the second comparative blanket, the printed pattern was deformed, and a portion of the 20 $\mu$m gaps were in contact in the width direction.

Thirteenth Embodiment

The present embodiment illustrates an example of creating an image display device comprising: an electron source provided with a plurality of cathodes which have an electron emitting portion between a pair of electrodes, wherein applying a desired voltage between the pair of electrodes causes electron emission; and an illuminant for emitting light under irradiation of electrons discharged from the electron source. In the present embodiment, the electrodes for the above cathodes were printed and formed using the offset printing apparatus shown in FIG. 1, following the same printing conditions as the above-described first embodiment. The following is a description of the present embodiment, with reference to FIG. 18. Incidentally, for sake of simplifying the description, only 3 by 3 cathodes are shown in FIG. 18.

First, device electrodes 801 were arrayed and formed on the glass substrate in the same manner as with the first embodiment, using the offset printing apparatus shown in FIG. 1, the number thereof being 240 vertically and 480 horizontally (FIG. 18A). Next, lower lines 802 connecting one side of the device electrodes 801 were formed by screen printing using silver paste, and then baked (FIG. 18B).

An inter-layer insulating layer 803 was formed orthogonally with the lower lines 802 by screen printing using glass paste, and the baked. This was formed in a comb-tooth form, so as to not come into contact with the other of the device electrodes 801 (FIG. 18C).

Upper lines 805 contacting the device electrodes 801 were formed by screen printing on the inter-layer insulating layer 803 using silver paste (FIG. 18D). Next, an electroconductive film 809 was formed of PdO by the ink-jet method between the pair of device electrodes 801 (FIG. 18E).

Next, voltage was applied to the plurality of electroconductive films 809 formed between the device electrodes 801 via the upper lines 805 and lower lines 802, thereby forming cracks in each of the electroconductive films. Further, similar voltage was applied again in an atmosphere with acetone present, thereby forming a carbon film on each electroconductive film. Also, this carbon film was deposited so as to form a gap narrower than the above gap, following the gap within the electroconductive film 809.

A face plate formed in the order or a fluorescent material on a glass substrate and a metal back formed of aluminum was positioned so as to face the electron source substrate formed by the above processes, the surrounding portion thereof was encompasses with a housing, low-melt glass frit was applied to the junctions between the housing, face plate, and electron source substrate, and sealed, thus forming an envelope. This envelope is exhausted to a vacuum and sealed, thereby forming the image display device according to the present invention.

Good display with few irregularities in light emission brightness was obtained with the image display device according to the present embodiment thus obtained.

Incidentally, similar image display devices as that of the present embodiment were fabricated using the offset printing apparatuses and printing conditions described above in the second through twelfth embodiments, and each yielded good display with few irregularities in light emission brightness.

Further, the offset printing method and offset printing apparatus described above in the embodiments can be applied to color filters for liquid crystal displays and the like, and is not restricted to electron sources for image display devices.

Thus, the present is capable of providing an offset printing method and offset printing apparatus capable of securing excellent pattern form, ink receiving/transferring properties, and positional precision, for large plate-shaped work, as well.

What is claimed is:

1. An offset printing method, comprising the steps of:
   suspending a sheet-shaped or belt-shaped blanket by supporting leading and trailing portions thereof in the printing direction;
   performing ink reception from a plate to the blanket by pressing the blanket, using a pressuring jig, down onto the plate situated below and sweeping the pressuring jig in the printing direction; and
   transferring ink from the blanket to a work, by pressing the blanket, using the pressuring jig, down onto the work situated below and sweeping the pressuring jig in the printing direction.

2. An offset printing method according to claim 1, further comprising a step of controlling an approach angle α between the blanket and the plate or work surface, and a departing angle β thereof, at respective arbitrary angles from the beginning of printing to the end thereof.

3. An offset printing method according to claim 2, wherein $5°≦α≦60°$ and $5°≦β≦60°$ hold.

4. An offset printing method according to any of claims 1 through 3, wherein a mechanical percentage of elongation of the blanket is 3% or less in the printing direction, under a load of 1000 Kg/1 m width.

5. An offset printing method, comprising the steps of:
   suspending a sheet-shaped or belt-shaped blanket by supporting leading and trailing portions thereof in the printing direction;
   performing ink reception from a plate to the blanket by pressing the blanket, using a pressuring jig, down onto the plate situated below and sweeping the pressuring jig in the printing direction;
   transferring ink from the blanket to a work, by pressing the blanket, using the pressuring jig, down onto the work situated below and sweeping the pressuring jig in the printing direction; and
   correcting an error in printing dimensions which occurs at the time of said ink reception or said ink transferring, by moving a printing surface table at the time of said ink reception or said ink transferring.

6. An offset printing method according to claim 5, further comprising the step of measuring the amount of shifting at a relative position between the blanket and plate at the time of ink reception, or the amount of shifting at a relative position between the blanket and work at the time of transferring ink,
   wherein the measured amounts are taken as the amount of the error in printing dimensions at the time of ink reception and the amount of the error in printing dimension at the time of transferring ink, respectively.

7. An offset printing method according to either claim 5 or claim 6, wherein the error in printing dimensions at the time of ink reception and at the time of transferring ink is corrected by moving the printing surface table at the time of the ink reception and at the time of the ink transferring.

8. An offset printing method according to either claim 5 or claim 6, wherein the error in printing dimensions at the time of ink reception and the error in printing dimensions at the time of transferring ink are added and computed, and correction is made by moving the printing surface table at the time of the ink transferring.

9. An offset printing method according to claim 8, wherein the timing for performing correction of the amount of error in printing dimensions is carried out at the time of receiving ink, or at the time of transferring ink, or at both the time of receiving ink and the time of transferring ink before the printing operation, or wherein position detecting means computes a correction value concurrently with the printing operation in the printing direction and drives the surface table by an appropriate value.

10. An offset printing method according to claim 5, further comprising a step of computing a value for driving the printing surface table to move the printing surface table to correct the error in printing dimensions.

11. An offset printing method according to claim 7, wherein the timing for performing correction of the amount of error in printing dimensions is carried out at the time of receiving ink, or at the time of transferring ink, or at both the time of receiving ink and the time of transferring ink before the printing operation, or wherein position detecting means computes a correction value concurrently with the printing operation in the printing direction and drives the surface table by an appropriate value.

12. An offset printing method, comprising the steps of:
   suspending a sheet-shaped or belt-shaped blanket by supporting leading and trailing portions thereof in the printing direction;
   performing ink reception from a plate to the blanket by pressing the blanket, using a pressuring jig, down onto the plate situated below and sweeping the pressuring jig in the printing direction;
   transferring ink from the blanket to a work, by pressing the blanket, using the pressuring jig, down onto the work situated below and sweeping the pressuring jig in the printing direction; and
   correcting an error in printing dimensions which occurs at the time of said ink reception or said ink transferring, by moving a printing surface table,
   wherein said step of correcting the error in printing dimensions is carried out during one of the time of receiving ink, the time of transferring ink, both the time of receiving ink and the time of transferring ink before the printing operation, and concurrently with the printing operation.

13. An offset printing method, comprising the steps of:
   suspending a sheet-shaped or belt-shaped blanket by supporting leading and trailing portions thereof in the printing direction;
   performing ink reception from a plate to the blanket by pressing the blanket, using a pressuring jig, down onto the plate situated below and sweeping the pressuring jig in the printing direction;
   transferring ink from the blanket to a work, by pressing the blanket, using the pressuring jig, down onto the work situated below and sweeping the pressuring jig in the printing direction; and
   sequentially feeding an area used for ink reception and transfer every certain arbitrary number of printing times.

14. An offset printing method according to claim 13, wherein ink solvent contained in the blanket, which has been sequentially fed following printing, is removed by application of heat.

15. An offset printing method according to claim 14, wherein the blanket, which has had the ink solvent removed by application of heat, is cooled to room temperature.

16. An offset printing method according to any of the claims 13 through 15, wherein the surface of the blanket is silicone rubber.

17. An offset printing method, comprising the steps of:

suspending a sheet-shaped or belt-shaped blanket by supporting leading and trailing portions thereof in the printing direction;

performing ink reception from a plate to the blanket by pressing the blanket, using a pressuring jig, down onto the plate situated below and sweeping the pressuring jig in the printing direction;

transferring ink from the blanket to a work, by pressing the blanket, using the pressuring jig, down onto the work situated below and sweeping the pressuring jig in the printing direction; and controlling each of the tensions of the blanket, divided by the pressuring jig, either at one end of the blanket or at both ends thereof.

18. An offset printing method according to claim 17, wherein said step for controlling each of the tensions of the blanket includes a sub-step of detecting the tension of the blanket divided by the pressuring jig.

19. An offset printing apparatus comprising:

a blanket for receiving ink from a plate and transferring the ink to a work, said blanket being sheet-shaped or belt-shaped;

supporting members for said blanket, said blanket supporting members comprising two opposing shafts extending vertically with respect to the printing direction, for suspending said blanket by supporting both ends thereof; and a pressuring jig for pressing said blanket down onto the plate or work situated below and sweeping in the printing direction.

20. An offset printing apparatus according to claim 19, wherein both of the two opposing shafts for said blanket are capable of applying tension to said blanket and are supporting structures movable in a direction parallel to the printing direction.

21. An offset printing apparatus according to either claim 19 or claim 20, further comprising a mechanism for controlling an approach angle $\alpha$ between said blanket and the plate or work surface at the time of printing, and a departing angle $\beta$ thereof, at respective certain arbitrary angles from the beginning of printing to the end thereof.

22. An offset printing apparatus according to claim 21, wherein $5° \leq \alpha \leq 60°$ and $5° \leq \beta \leq 60°$ hold.

23. An offset printing apparatus according to claim 22, wherein the mechanical percentage of elongation of said blanket is 3% or less in the printing direction, under a load of 1,000 kg/1 m width.

24. An offset printing apparatus according to claim 21, wherein the mechanical percentage of elongation of said blanket is 3% or less in the printing direction, under a load of 1,000 kg/1 m width.

25. An offset printing apparatus according to either claim 19 or claim 20, wherein the mechanical percentage of elongation of said blanket is 3% or less in the printing direction, under a load of 1,000 kg/1 m width.

26. An offset printing apparatus comprising:

a blanket for receiving ink from a plate and transferring the ink to a work, said blanket being sheet-shaped or belt-shaped;

supporting members for said blanket, said blanket supporting members comprising two opposing shafts extending vertically with respect to the printing direction, for suspending said blanket by supporting both ends thereof;

a pressuring jig for pressing said blanket down onto the plate or work situated below on a printing surface table, and sweeping in the printing direction; and means for moving the printing surface table.

27. An offset printing apparatus according to claim 26, further comprising means for computing a motion amount of the surface table, which is equivalent to a printing correction value corresponding to an error in printing dimensions at the time of ink reception and at the time of ink transfer, and performing computation processing of an appropriate value for driving the surface table.

28. An offset printing apparatus comprising:

a blanket for receiving ink from a plate and transferring the ink to a work, said blanket being sheet-shaped or belt-shaped;

supporting members for said blanket, said blanket supporting members comprising two opposing shafts extending vertically with respect to the printing direction, for suspending said blanket by supporting both ends thereof;

a pressuring jig for pressing said blanket down onto the plate or work situated below, and sweeping in the printing direction; and a mechanism for sequentially feeding the area of said blanket used for the ink reception and transfer every certain arbitrary number of printing times.

29. An offset printing apparatus according to claim 28, further comprising a mechanism wherein ink solvent contained in said blanket, which has been sequentially fed following printing, is removed by application of heat.

30. An offset printing apparatus according to claim 29, further comprising a mechanism wherein said blanket, which has had the ink solvent removed by application of heat, is cooled to room temperature.

31. An offset printing apparatus according to any one of claims 28 through 30, wherein the surface of said blanket is silicone rubber.

32. An offset printing apparatus comprising:

a blanket for receiving ink from a plate and transferring the ink to a work, said blanket being sheet-shaped or belt-shaped;

supporting members for said blanket, said blanket supporting members comprising two opposing shafts extending vertically with respect to the printing direction, for suspending said blanket by supporting both ends thereof;

a pressuring jig for pressing said blanket down onto the plate or work situated below, and sweeping in the printing direction; and means for adjusting the tension of said blanket.

33. An offset printing apparatus comprising:

a blanket for receiving ink from a plate and transferring the ink to a work, said blanket being sheet-shaped or belt-shaped;

supporting members for said blanket, said blanket supporting members comprising two opposing shafts extending vertically with respect to the printing direction, for suspending said blanket by supporting both ends thereof and said supporting members being supporting structures movable in directions parallel to the printing direction; and a pressuring jig for pressing said blanket down onto the plate or work situated below, and sweeping in the printing direction.

34. An offset printing apparatus comprising:

a blanket for receiving ink from a plate and transferring the ink to a work, said blanket being sheet-shaped or belt-shaped;

supporting members for said blanket, said blanket supporting members comprising two opposing shafts extending vertically with respect to the printing direction, for suspending said blanket by supporting both ends thereof; and a pressuring jig for pressing said blanket down onto the plate or work situated below, and sweeping in the printing direction, said pressuring jig comprising a roller for pressing said blanket.

35. An offset printing apparatus according to claim 34, further comprising means for providing rotating force to said pressuring roller.

* * * * *

UNITED STATES PATENT AND TRADEMARK OFFICE
CERTIFICATE OF CORRECTION

PATENT NO. : 6,425,325 B1
DATED : July 30, 2002
INVENTOR(S) : Mukai et al.

It is certified that error appears in the above-identified patent and that said Letters Patent is hereby corrected as shown below:

Column 7,
Line 53, "phenomena" should read -- phenomenon --; and
Line 59, "shifts" should read -- shift --.

Column 8,
Line 12, "maybe" should read -- may be --; and
Line 14, "even," should read -- event, --.

Column 16,
Line 63, "so" should read -- so that --.

Column 18,
Line 41, "blanked" should read -- blanket --.

Column 19,
Line 2, "denotes" should read -- denote --.

Column 26,
Line 3, "loosing" should read -- losing --.

Column 27,
Line 11, "become" should read -- becomes --.

Column 28,
Line 65, "become" should read -- becomes --.

Column 30,
Line 35, "are" should read -- were --.

UNITED STATES PATENT AND TRADEMARK OFFICE
CERTIFICATE OF CORRECTION

PATENT NO. : 6,425,325 B1
DATED : July 30, 2002
INVENTOR(S) : Mukai et al.

It is certified that error appears in the above-identified patent and that said Letters Patent is hereby corrected as shown below:

<u>Column 34,</u>
Line 25, "sake" should read -- the sake --;
Line 36, "the baked" should read -- then baked --; and
Line 57, "encompasses" should read -- encompassed --.

Signed and Sealed this

Twenty-second Day of April, 2003

JAMES E. ROGAN
*Director of the United States Patent and Trademark Office*